US010056404B2

(12) United States Patent
Lee et al.

(10) Patent No.: US 10,056,404 B2
(45) Date of Patent: Aug. 21, 2018

(54) SEMICONDUCTOR MEMORY DEVICES HAVING CLOSELY SPACED BIT LINES

(71) Applicants: Jaeduk Lee, Seongnam-si (KR); Youngwoo Park, Seoul (KR)

(72) Inventors: Jaeduk Lee, Seongnam-si (KR); Youngwoo Park, Seoul (KR)

(73) Assignee: Samsung Electronics Co., Ltd. (KR)

( * ) Notice: Subject to any disclaimer, the term of this patent is extended or adjusted under 35 U.S.C. 154(b) by 146 days.

(21) Appl. No.: 14/989,955

(22) Filed: Jan. 7, 2016

(65) Prior Publication Data

US 2017/0040338 A1 Feb. 9, 2017

(30) Foreign Application Priority Data

Aug. 7, 2015 (KR) .................. 10-2015-0111749

(51) Int. Cl.
*H01L 29/792* (2006.01)
*H01L 27/11582* (2017.01)
*H01L 27/11573* (2017.01)
*H01L 27/06* (2006.01)

(52) U.S. Cl.
CPC .... *H01L 27/11582* (2013.01); *H01L 27/0688* (2013.01); *H01L 27/11573* (2013.01)

(58) Field of Classification Search
CPC ......... H01L 27/11573; H01L 27/11582; H01L 23/528
USPC ...................................................... 257/324
See application file for complete search history.

(56) References Cited

U.S. PATENT DOCUMENTS

| 8,284,589 | B2 | 10/2012 | Scheuerlein |
| 8,343,814 | B2 | 1/2013 | Bucki et al. |
| 8,553,445 | B2 | 10/2013 | Baek et al. |
| 8,593,847 | B2 | 11/2013 | Kim |
| 8,654,584 | B2 | 2/2014 | Kim et al. |
| 8,717,804 | B2 | 5/2014 | Toda |
| 8,861,279 | B2 | 10/2014 | Hishida et al. |
| 9,019,739 | B2 | 4/2015 | Park et al. |
| 2009/0166682 | A1* | 7/2009 | Scheuerlein ........... B82Y 10/00 257/211 |
| 2013/0194867 | A1* | 8/2013 | Fukuda .............. G11C 14/0018 365/185.08 |
| 2014/0085979 | A1 | 3/2014 | Kono |
| 2014/0097484 | A1* | 4/2014 | Seol .................. H01L 29/42332 257/324 |

(Continued)

FOREIGN PATENT DOCUMENTS

KR 1020140101705 A 8/2014

*Primary Examiner* — Vongsavanh Sengdara
(74) *Attorney, Agent, or Firm* — Myers Bigel, P.A.

(57) ABSTRACT

The inventive concepts relate to a semiconductor memory device. The semiconductor memory device includes a substrate including a circuit region and first and second connection regions respectively disposed at both sides of the circuit region opposite to each other, a logic structure including a logic circuit disposed on the circuit region and a lower insulating layer covering the logic circuit, and a memory structure on the logic structure. The logic circuit includes a first page buffer disposed adjacently to the first connection region and a second page buffer disposed adjacently to the second connection region. The memory structure includes bit lines extending onto at least one of the first and second connection regions.

17 Claims, 30 Drawing Sheets

(56) References Cited

U.S. PATENT DOCUMENTS

2014/0380109 A1* 12/2014 Kim .................. G11C 29/50004
    714/721
2015/0023103 A1    1/2015 Aritome
2015/0055414 A1    2/2015 Chen \* cited by examiner

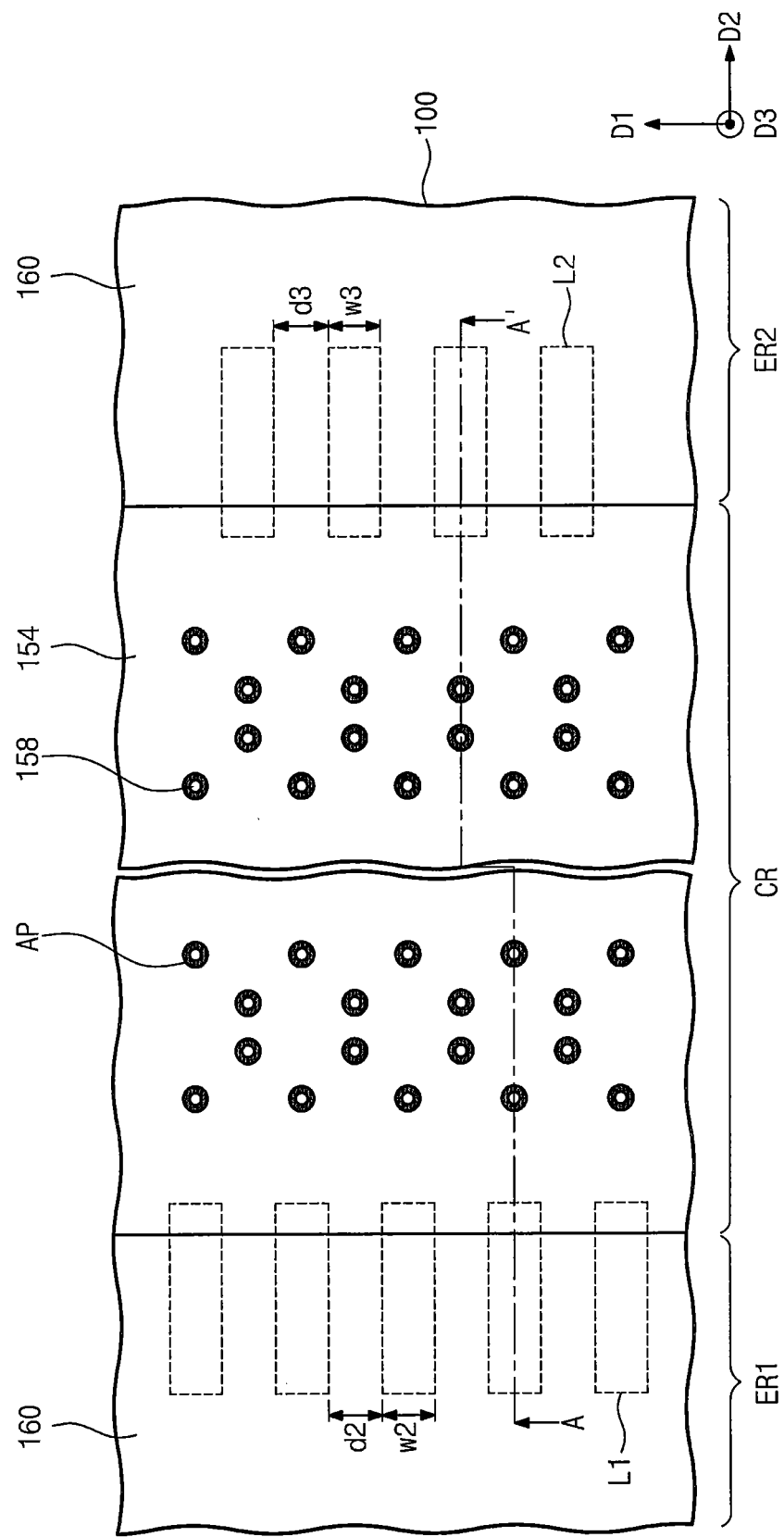

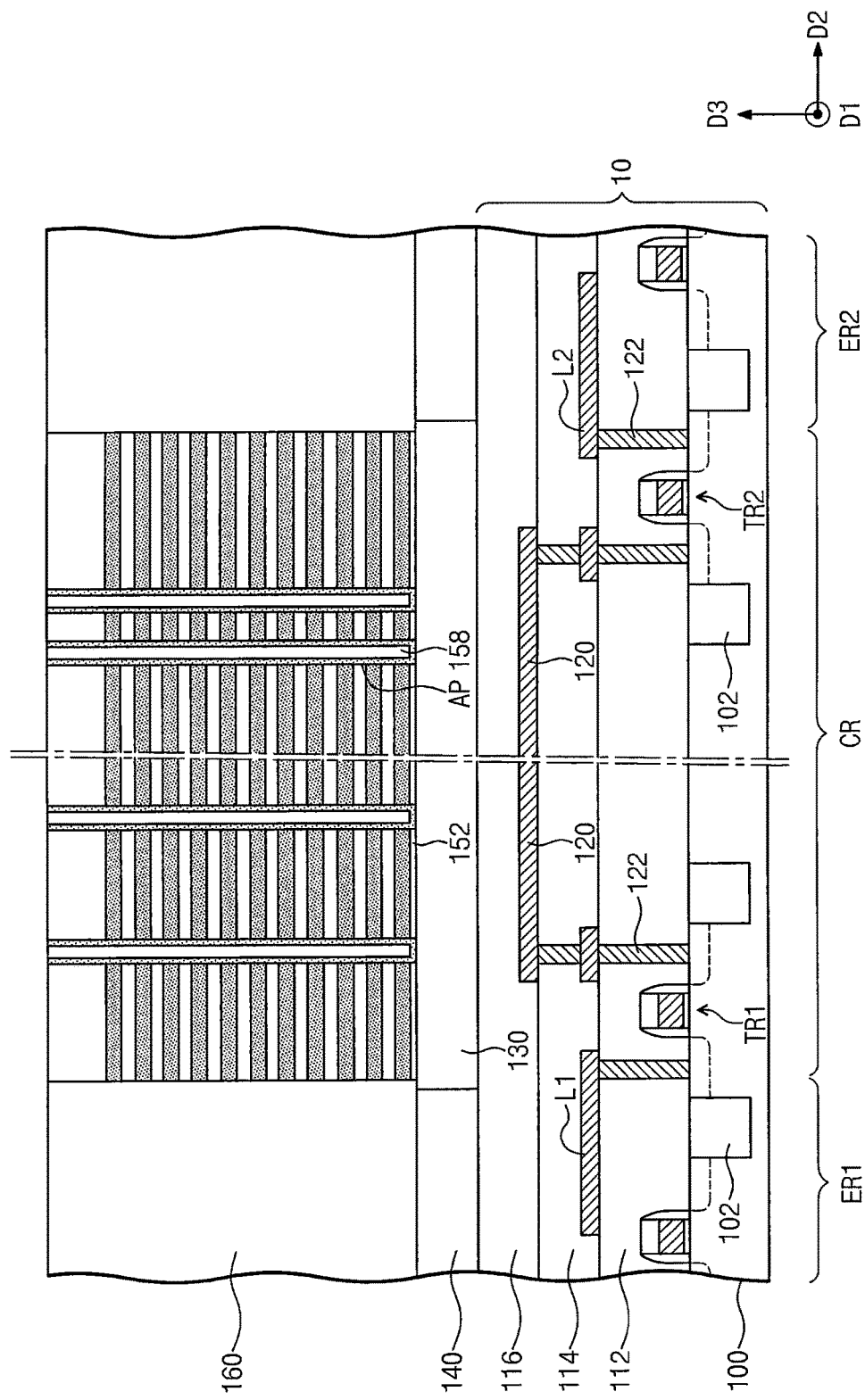

SEMICONDUCTOR MEMORY DEVICES HAVING CLOSELY SPACED BIT LINES

CROSS-REFERENCE TO RELATED APPLICATION

This U.S. non-provisional patent application claims priority under 35 U.S.C. § 119 to Korean Patent Application No. 10-2015-0111749, filed on Aug. 7, 2015 in the Korean Intellectual Property Office, the entire content of which is hereby incorporated herein by reference in its entirety.

BACKGROUND

The inventive concepts relate to semiconductor memory devices.

Semiconductor devices have been highly integrated to provide increased performance and reduced manufacturing costs. Integration densities of semiconductor devices may directly affect the costs of the semiconductor devices. An integration density of a two-dimensional (2D) or planar semiconductor memory device may be mainly determined by an area of a unit memory cell. Thus, the integration density of the 2D semiconductor memory device may be greatly affected by a technique of forming fine patterns. However, since extremely high-priced apparatuses are needed to form very fine patterns, the integration density of 2D semiconductor memory devices may continue to increase but may be still limited. Thus, semiconductor memory devices including three-dimensionally arranged memory cells have been developed.

SUMMARY

Embodiments of the inventive concepts may provide semiconductor memory devices having improved electrical characteristics and integration density.

In one aspect, a semiconductor memory device includes a substrate having an upper surface that extends in a first direction and in a second direction that is perpendicular to the first direction; a memory cell array on the substrate; a first page buffer; a second page buffer; and a plurality of bit lines that extend in the second direction to at least partly cross the memory cell array. The bit lines include a plurality of first bit lines that are electrically connected to the first page buffer and a plurality of second bit lines that are electrically connected to the second page buffer. The first bit lines and the second bit lines are alternately and repeatedly arranged in the first direction.

In an embodiment, the first bit lines may have respective first end portions that are adjacent a first side of the memory cell array and respective second end portions that are adjacent a second side of the memory cell array, and the second bit lines may have respective first end portions that are adjacent the first side of the memory cell array and respective second end portions that are adjacent the second side of the memory cell array. In such embodiments, the semiconductor memory device may also include a plurality of first connection contacts that extend in a third direction that is perpendicular to the first and second directions that connect the first end portions of the first bit lines to the first page buffer and a plurality of second connection contacts that extend in a third direction that connect the first end portions of the second bit lines to the second page buffer.

In an embodiment, the semiconductor memory device may further include a plurality of first connection conductive lines that extend in the second direction, the first connection conductive lines electrically connected to respective ones of the first bit lines; and a plurality of second connection conductive lines that extend in the second direction, the second connection conductive lines electrically connected to respective ones of the second bit lines.

In an embodiment, an average width of a first of the first connection conductive lines in the first direction may be greater than an average width in the first direction of a first of the first bit lines, and an average width of a first of the second connection conductive lines in the first direction may be greater than an average width in the first direction of a first of the second bit lines.

In an embodiment, a first distance between adjacent ones of the first connection conductive lines may be greater than a second distance between adjacent ones of the bit lines, and a third distance between adjacent ones of the second connection conductive lines may be greater than the second distance.

In an embodiment, a pitch of the first connection conductive lines may be greater than a pitch of the bit lines, and a pitch of the second connection conductive lines may be greater than the pitch of the bit lines.

In an embodiment, the substrate may include a first connection region, a second connection region and a circuit region therebetween, the memory cell array may be disposed on the circuit region, and the first bit lines may extend onto the first connection region and the second bit lines may extend onto the second connection region.

In an embodiment, a maximum width of a first portion of a first of the first bit lines that is on the first connection region may exceed a maximum width of a second portion of the first of the first bit lines that crosses the memory cell array, and a maximum width of a first portion of a first of the second bit lines that is on the second connection region may exceed a maximum width of a second portion of the first of the second bit lines that crosses the memory cell array.

In an embodiment, a maximum width of a first portion of a first of the first connection conductive lines that is on the first connection region may exceed a maximum width of a second portion of the first of the first connection conductive lines that is under the memory cell array, and a maximum width of a first portion of a first of the second connection conductive lines that is on the second connection region may exceed a maximum width of a second portion of the first of the second connection conductive lines that is under the memory cell array.

In an embodiment, a first of the first bit lines may extend a different distance in the second direction onto the first connection region than does a second of the first bit lines that is adjacent the first of the first bit lines.

In an embodiment, a first of the first connection conductive lines may extend a different distance in the second direction onto the first connection region than does a second of the first connection conductive lines that is adjacent to the first of the first connection conductive lines, and a first of the second connection conductive lines may extend a different distance in the second direction onto the second connection region than does a second of the second connection conductive lines that is adjacent to the first of the second connection conductive lines.

In an embodiment, the memory cell array may include a semiconductor layer; a stack structure including a plurality of electrodes that are stacked on the semiconductor layer in a third direction that is perpendicular to the first direction and to the second direction; a plurality of active pillars penetrating the stack structure in the third direction; and a data storage element disposed between each of the active pillars and the electrodes.

In an embodiment, the stack structure may comprise a first of a plurality of stack structures that are spaced apart from each other in the second direction, and the semiconductor memory device may further include an upper insulating layer on outer sidewalls of the outermost ones of the stack structures, the upper insulating layer extending onto the first and second connection regions; first connection contacts penetrating a first portion of the upper insulating layer that is on the first connection region, the first connection contacts electrically connecting the first bit lines to the first connection conductive lines; and second connection contacts penetrating a second portion of the upper insulating layer that is on the second connection region, the second connection contacts electrically connecting the second bit lines to the second connection conductive lines.

In an embodiment, lower ends of the first connection contacts may directly contact respective ones of a plurality of first connection conductive pads, and lower ends of the second connection conductive contacts may directly contact respective ones of a plurality of second connection conductive pads.

In an embodiment, the first and second connection conductive pads may have widths that are greater than widths of the first and second connection conductive lines.

In an embodiment, the memory cell array may comprise a semiconductor layer; a stack structure including a plurality of electrodes that are stacked on the semiconductor layer in a third direction that is perpendicular to the first direction and to the second direction; and a plurality of active pillars penetrating the stack structure in the third direction, where each of the active pillars includes a pair of vertical portions that penetrate the stack structure and a horizontal portion that connects bottom ends of the vertical portions to each other.

In an embodiment, the semiconductor memory device may further include a plurality of first lower contacts and a plurality of second lower contacts, the first and second lower contacts extending in a third direction that is perpendicular to the first direction and to the second direction; and a plurality of first connection contacts and a plurality of second connection contacts, the first and second connection contacts extending in the third direction. In such embodiments, the first connection conductive lines may directly contact respective ones of the first lower contacts and respective ones of the first connection contacts and the second connection conductive lines may directly contact respective ones of the second lower contacts and respective ones of the second connection contacts.

In an embodiment, the first and second page buffers may be part of a logic circuit that is formed on the substrate, and the semiconductor memory device may further include an insulating layer on the logic circuit opposite the substrate, where the memory cell array is on the insulating layer opposite the logic circuit.

In an embodiment, each of the first and second bit lines may include a first conductive material, and each of the first and second connection conductive lines may include a second conductive material that has a melting point that is higher than a melting point of the first conductive material. In some such embodiments, the first conductive material may include copper (Cu) or aluminum (Al) and the second conductive material may include tungsten (W).

In another aspect, a semiconductor memory device includes a substrate having a circuit region and first and second connection regions on opposed sides of the circuit region, the substrate including an upper surface that extends in a first direction and in a second direction that is perpendicular to the first direction; a memory cell array on the substrate; a plurality of bit lines that extend in the second direction to at least partially cross the circuit region, the bit lines spaced apart from each other in the first direction; and a plurality of connection conductive lines that extend in the second direction and that are electrically connected to respective ones of the bit lines. An average width of a first of the connection conductive lines is greater than an average width of the one of the bit lines to which the first of the connection conductive lines is electrically connected.

In an embodiment, the semiconductor memory device may further include a page buffer circuit that has a first page buffer and a second page buffer, and the connection conductive lines may comprise first connection conductive lines and second connection conductive lines.

In an embodiment, the bit lines may comprise first bit lines that are electrically connected to the first page buffer by respective ones of the first connection conductive lines and second bit lines that are electrically connected to the second page buffer by respective ones of the second connection conductive lines, where the first bit lines and the second bit lines are alternately and repeatedly arranged in the first direction.

In an embodiment, the semiconductor memory device may further include a plurality of first lower contacts and a plurality of second lower contacts that extend in a third direction that is perpendicular to the first direction and to the second direction; and a plurality of first connection contacts and a plurality of second connection contacts that extend in the third direction. In such embodiments, each first connection conductive line may directly contact a respective one of the first lower contacts and a respective one of the first connection contacts, and each second connection conductive line may directly contact a respective one of the second lower contacts and a respective one of the second connection contacts.

In an embodiment, each bit line may have a first end portion that is adjacent a first side of the memory cell array and a second end portion that is adjacent a second side of the memory cell array, and the first end portions of the first bit lines may directly contact respective ones of the first connection contacts and the second end portions of the second bit lines may directly contact respective ones of the second connection contacts.

In an embodiment, the first end portions of the first bit lines may be aligned along a first imaginary line that extends in the first direction and the first end portions of the second bit lines may be aligned along a second imaginary line that extends in the first direction, and the first imaginary line may be spaced apart from the second imaginary line in the second direction.

In an embodiment, the first end portions of the first bit lines may have an expanded width in the first direction.

In an embodiment, the first end portions of a first subset of the first bit lines may be aligned along a first imaginary line that extends in the first direction, the first end portions of a second subset of the first bit lines may be aligned along a second imaginary line that extends in the first direction, and the first end portions of the second bit lines may be aligned along a third imaginary line that extends in the first direction, the first, second and third imaginary lines being spaced apart from each other in the second direction.

In an embodiment, the first end portions of at least some of the first bit lines may have an expanded width in the first direction.

In an embodiment, portions of the first connection conductive lines that directly contact the respective first connection contacts may have an expanded width in the first direction.

In an embodiment, the first and second bit lines may include a first conductive material, and the first and second connection conductive lines may include a second conductive material that has a melting point that is higher than a melting point of the first conductive material. In such embodiments, the first conductive material may include copper (Cu) or aluminum (Al) and the second conductive material may include tungsten (W).

In an embodiment, the memory cell array may comprise a stack structure that includes plurality of gate electrodes that each extend in the first direction and that are stacked in the third direction on the substrate.

In an embodiment, the semiconductor memory device may further include an insulating layer that penetrates the stack structure, where at least some of the first connection contacts penetrate the insulating layer.

In an embodiment, first end portions of the first bit lines may extend onto the first connection region but second end portions of the first bit lines may not extend onto the second connection region, and second end portions of the second bit lines may extend onto the second connection region but first end portions of the second bit lines may not extend onto the first connection region.

In another aspect, a semiconductor memory device includes a substrate having an upper surface that extends in a first direction and in a second direction that is perpendicular to the first direction; a logic circuit on the upper surface of the substrate, the logic circuit including a first page buffer; and a memory cell array on the logic circuit opposite the substrate. The memory cell array may include a semiconductor layer; a plurality of stack structures that are spaced apart from each other in the second direction, the stack structures including a plurality of electrodes that are stacked on the semiconductor layer in a third direction that is perpendicular to the first and second directions; a plurality of first bit lines that extend in the second direction to at least partially cross the stack structures, the first bit lines spaced apart from each other in the first direction; and a plurality of insulating layers that extend in the first direction that are provided between adjacent ones of the stack structures. The semiconductor memory device may further include a plurality of first connection contacts that penetrate a first of the insulating layers, the first connection contacts electrically connecting respective ones of the first bit lines to the first page buffer In an embodiment, the memory cell array may further include a plurality of second bit lines that extend in the second direction to at least partially cross the stack structures, the first and second bit lines alternately and repeatedly arranged in the first direction. In such embodiments, the semiconductor memory device may further include a second page buffer; and a plurality of second connection contacts that electrically connect respective ones of the second bit lines to the second page buffer.

In an embodiment, the semiconductor memory device may also include a plurality of first connection conductive lines that extend in the second direction, the first connection conductive lines electrically connecting to respective ones of the first bit lines to the first page buffer; and a plurality of second connection conductive lines that extend in the second direction, the second connection conductive lines electrically connecting respective ones of the second bit lines to the second page buffer.

In an embodiment, an average width of a first of the first connection conductive lines in the first direction may be greater than an average width in the first direction of a first of the first bit lines, and an average width of a first of the second connection conductive lines in the first direction may be greater than an average width in the first direction of a first of the second bit lines.

In an embodiment, a first distance between adjacent ones of the first connection conductive lines may be greater than a second distance between adjacent ones of the first and second bit lines, and a third distance between adjacent ones of the second connection conductive lines may be greater than the second distance.

In an embodiment, a pitch of the first connection conductive lines may be greater than a pitch of the combination of the first and second bit lines, and a pitch of the second connection conductive lines may be greater than the pitch of the combination of the first and second bit lines.

In an embodiment, the second connection contacts may penetrate a second of the insulating layers.

In one aspect, a semiconductor device may include a substrate including a circuit region and first and second connection regions respectively disposed at both sides of the circuit region opposite to each other, a logic structure including a logic circuit disposed on the circuit region and a lower insulating layer covering the logic circuit, and a memory structure on the logic structure. The logic circuit may include a first page buffer disposed adjacently to the first connection region and a second page buffer disposed adjacently to the second connection region. The memory structure may include bit lines extending onto at least one of the first and second connection regions. The bit limes may include first bit lines electrically connected to the first page buffer, and second bit lines electrically connected to the second page buffer. The first bit lines and the second bit lines may be alternately and repeatedly arranged in a direction intersecting a longitudinal direction of the first and second bit lines.

In an embodiment, the logic structure may further include first connection conductive lines electrically connecting the first page buffer to the first bit lines and extending onto the first connection region, and second connection conductive lines electrically connecting the second page buffer to the second bit lines and extending onto the second connection region. The first connection conductive lines may overlap with the first bit lines when viewed from a plan view, and the second connection conductive lines may overlap with the second bit lines when viewed from a plan view.

In an embodiment, a distance between the first connection conductive lines and a distance between the second connection conductive lines may be greater than a distance between the first and second bit lines adjacent to each other.

In an embodiment, a width of each of the first connection conductive lines may be greater than a width of each of the first bit lines, and a width of each of the second connection conductive lines may be greater than a width of each of the second bit lines.

In an embodiment, one end portion of each of the first bit lines may extend onto the first connection region, but another end portion of each of the first bit lines may not extend onto the second connection region. One end portion of each of the second bit lines may extend onto the second connection region but another end portion of each of the second bit lines may not extend onto the first connection region.

In an embodiment, on the first connection region, a width of one end portion of each of the first bit lines may be greater than a width of a line portion of each of the first bit lines. On the second connection region, a width of one end portion of each of the second bit lines may be greater than a width of a line portion of each of the second bit lines.

In an embodiment, on the first connection region, a width of one end portion of each of the first connection conductive lines may be greater than a width of a line portion of each of the first connection conductive lines. On the second connection region, a width of one end portion of each of the second connection conductive lines may be greater than a width of a line portion of each of the second connection conductive lines.

In an embodiment, one of the first bit lines adjacent to each other may laterally protrude from the other of the first bit lines adjacent to each other on the first connection region, and one of the second bit lines adjacent to each other may laterally protrude from the other of the second bit lines adjacent to each other on the second connection region.

In an embodiment, one of the first connection conductive lines adjacent to each other may laterally protrudes from the other of the first connection conductive lines adjacent to each other on the first connection region, and one of the second connection conductive lines adjacent to each other may laterally protrude from the other of the second connection conductive lines adjacent to each other on the second connection region.

In an embodiment, the memory structure may further include a semiconductor layer, a stack structure including a plurality of electrodes vertically stacked on the semiconductor layer, and a plurality of active pillars penetrating the stack structure. The first and second bit lines may be electrically connected to top ends of the active pillars.

In an embodiment, the memory structure may further include a data storage element disposed between each of the active pillars and the electrodes.

In an embodiment, the stack structure includes a plurality of stack structures spaced apart from each other in the longitudinal direction of the first and second bit lines. In this case, the semiconductor device may further include an upper insulating layer covering sidewalls of the outermost ones of the stack structures and extending onto the first and second connection regions, first connection contacts disposed in the upper insulating layer of the first connection region to electrically connect the first bit lines to the first connection conductive lines, and second connection contacts disposed in the upper insulating layer of the second connection region to electrically connect the second bit lines to the second connection conductive lines.

In an embodiment, the lower insulating layer may extend onto the first and second connection regions. In this case, the semiconductor device may further include first connection conductive pads disposed in the lower insulating layer of the first connection region so as to be in contact with one-end portions of the first connection contacts, and second connection conductive pads disposed in the lower insulating layer of the second connection region so as to be in contact with one-end portions of the second connection contacts.

In an embodiment, widths of the first connection conductive pads may be greater than widths of the first connection conductive lines, and widths of the second connection conductive pads may be greater than widths of the second connection conductive lines.

In an embodiment, each of the active pillars may include vertical portions penetrating the stack structure and a horizontal portion disposed under the stack structure to connect the vertical portions to each other.

In an embodiment, each of the first and second bit lines may include a first conductive material, and each of the first and second connection conductive lines may include a second conductive material of which a melting point is higher than that of the first conductive material.

In an embodiment, the first conductive material may include copper (Cu) or aluminum (Al), and the second conductive material may include tungsten (W).

In another aspect, a semiconductor device may include a logic structure and a memory structure sequentially stacked on a substrate. The logic structure may include a first page buffer disposed adjacently to one side of the memory structure, and a second page buffer disposed adjacently to another side, opposite to the one side, of the memory structure. The memory structure may include first bit lines electrically connected to the first page buffer, and second bit lines electrically connected to the second page buffer. The first bit lines and the second bit lines may extend along a direction in which the first and second page buffers are opposite to each other. The first bit lines and the second bit lines may be alternately and repeatedly arranged along a direction intersecting the extending direction of the first and second bit lines.

In an embodiment, the logic structure may further include first connection conductive lines electrically connected to first logic transistors constituting the first page buffer, and second connection conductive lines electrically connected to second logic transistors constituting the second page buffer. The first connection conductive lines may overlap with the first bit lines when viewed from a plan view, and the second connection conductive lines may overlap with the second bit lines when viewed from a plan view.

In an embodiment, the first and second bit lines may be alternately and repeatedly arranged with a first pitch. The first connection conductive lines may have a second pitch greater than the first pitch, and the second connection conductive lines may have a third pitch greater than the first pitch.

In an embodiment, one end portion of each of the first bit lines may laterally protrude from the one side of the memory structure, but another end portion of each of the first bit lines may not laterally protrude from the another side of the memory structure. One end portion of each of the second bit lines may laterally protrude from the another side of the memory structure, but another end portion of each of the second bit lines may not laterally protrude from the one side of the memory structure.

In an embodiment, a width of the one end portion of each of the first bit lines may be wider than a width of a line portion of each of the first bit lines, and a width of the one end portion of each of the second bit lines may be wider than a width of a line portion of each of the second bit lines.

In an embodiment, a protruding length, from the one side of the memory structure, of one of the first bit lines adjacent to each other may be greater than that of the other of the first bit lines adjacent to each other. A protruding length, from the another side of the memory structure, of one of the second bit lines adjacent to each other may be greater than that of the other of the second bit lines adjacent to each other.

In an embodiment, the memory structure may further include a semiconductor layer, stack structures disposed on the semiconductor layer, and a plurality of active pillars penetrating each of the stack structures. Each of the stack structures may include a plurality of electrodes vertically stacked on the semiconductor layer. The stack structures may be spaced apart from each other in the extending direction of the first and second bit lines, and the first and second bit lines may be electrically connected to top ends of the active pillars.

In an embodiment, the memory structure may further include a data storage element disposed between each of the active pillars and the electrodes.

In an embodiment, the semiconductor device may further include an upper insulating layer, first connection contacts, and second connection contacts. The upper insulating layer may cover sidewalls of the outermost ones of the stack structures. One of the outermost stack structures may be adjacent to the first page buffer, and another of the outermost stack structures may be adjacent to the second page buffer. The first connection contacts may penetrate the upper insulating layer covering the sidewall of the one outermost stack structure to electrically connect the first bit lines to the first connection conductive lines, and the second connection contacts may penetrate the upper insulating layer covering the sidewall of the another outermost stack structure to electrically connect the second bit lines to the second connection conductive lines.

In an embodiment, the semiconductor device may further include an upper insulating layer covering sidewalls of the outermost ones of the stack structures, first connection contacts penetrating the upper insulating layer covering the sidewall of one of the outermost stack structures, and second connection contacts disposed between the stack structures adjacent to each other. The first connection contacts may constitute a first group, and the second connection contacts may constitute a second group. The first bit lines may be electrically connected to the first connection conductive lines through the connection contacts of one of the first and second groups, and the second bit lines may be electrically connected to the second connection conductive lines through the connection contacts of the other of the first and second groups.

In an embodiment, one of the outermost stack structures may be adjacent to the first page buffer, and another of the outermost stack structures may be adjacent to the second page buffer. The first connection contacts may penetrate the upper insulating layer covering the sidewall of the one outermost stack structure if the first bit lines are electrically connected to the first connection conductive lines through the first connection contacts. Alternatively, the first connection contacts may penetrate the upper insulating layer covering the sidewall of the another outermost stack structure if the second bit lines are electrically connected to the second connection conductive lines through the first connection contacts.

BRIEF DESCRIPTION OF THE DRAWINGS

The inventive concepts will become more apparent in view of the attached drawings and accompanying detailed description.

FIGS. 6A to 12A are plan views illustrating a method of manufacturing a semiconductor memory device according to an embodiment of the inventive concepts.

FIGS. 6B to 12B are cross-sectional views taken along lines A-A' of FIGS. 6A to 12A, respectively.

DETAILED DESCRIPTION OF THE EMBODIMENTS

Figure 1:
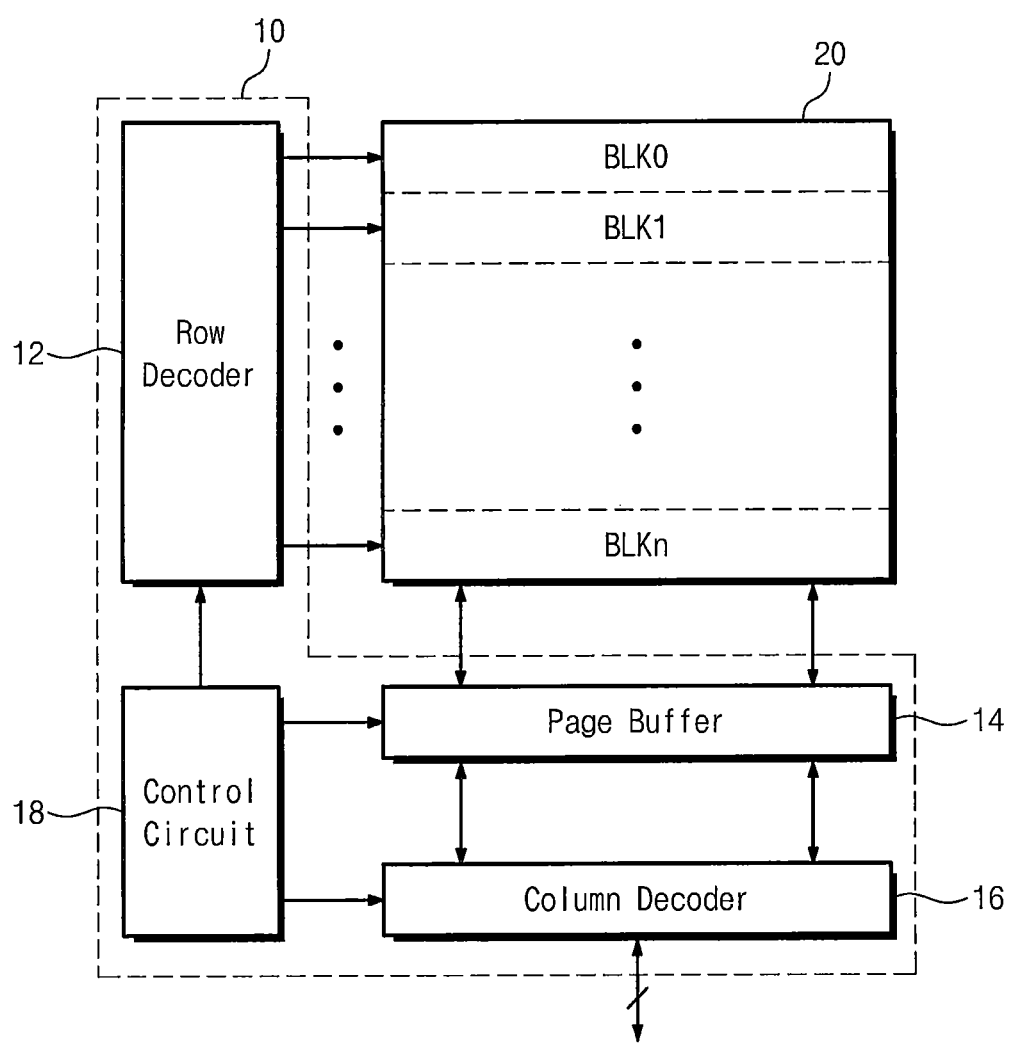
FIG. 1 is a schematic block diagram illustrating a semiconductor memory device according to an embodiment of the inventive concepts.

The inventive concepts will now be described more fully hereinafter with reference to the accompanying drawings, in which exemplary embodiments of the inventive concepts are shown. The advantages and features of the inventive concepts and methods of achieving them will be apparent from the following exemplary embodiments that will be described in more detail with reference to the accompanying drawings. It should be noted, however, that the inventive concepts are not limited to the following exemplary embodiments, and may be implemented in various other forms. Accordingly, the exemplary embodiments are provided only to disclose the inventive concepts and let those skilled in the art know the category of the inventive concepts. In the drawings, the sizes of various elements may be exaggerated for clarity. The same reference numerals or the same reference designators denote the same elements throughout the specification.

The terminology used herein is for the purpose of describing particular embodiments only and is not intended to limit the inventive concepts. As used herein, the singular terms "a," "an" and "the" are intended to include the plural forms as well, unless the context clearly indicates otherwise. As used herein, the term "and/or" includes any and all combinations of one or more of the associated listed items. It will be further understood that the terms "comprises", "comprising,", "includes" and/or "including", when used herein, specify the presence of stated features, steps, operations, elements, and/or components, but do not preclude the presence or addition of one or more other features, steps, operations, elements, components, and/or groups thereof. Similarly, it will be understood that when an element such as a layer, region or substrate is referred to as being "on" another element, it can be directly on the other element or intervening elements may be present. In contrast, the term "directly" means that there are no intervening elements. It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the inventive concepts.

Additionally, the exemplary embodiments in the detailed description are described with reference to cross-sectional views and/or plan views that illustrate ideal exemplary views of the inventive concepts. Accordingly, shapes of actual devices may vary from the shapes illustrated herein due, for example, to manufacturing techniques and/or allowable errors. Therefore, the embodiments of the inventive concepts are not limited to the specific shapes illustrated in the exemplary views, but may include other shapes that may result from, for example, manufacturing processes. For example, an etching region illustrated as a rectangle may have rounded or curved features. Thus, the regions illustrated in the figures are schematic in nature and their shapes are not intended to limit the scope of example embodiments.

Hereinafter, embodiments of the inventive concepts will be described in more detail with reference to the drawings.

FIG. 1 is a schematic block diagram illustrating a semiconductor memory device according to an embodiment of the inventive concepts.

Referring to FIG. 1, the semiconductor memory device may include control logic 10 and a memory cell array 20. The control logic 10 may include a row decoder 12, a page buffer 14, a column decoder 16, and a control circuit 18. The memory cell array 20 may include a plurality of memory blocks BLK0 to BLKn. Each of the memory blocks BLK0 to BLKn may include a plurality of memory cells, a plurality of word lines, and a plurality of bit lines. The word lines and the bit lines may be electrically connected to the memory cells.

The row decoder 12 may decode an address signal that is input from an external source to select one of the word lines. The address signal decoded in the row decoder 12 may be provided to a row driver (not shown), and the row driver may provide word line voltages generated from a voltage generating circuit (not shown) to the selected word line and unselected word lines in response to a control signal of the control circuit 18. The word line voltage provided to the selected word line may be different from the word line voltages provided to the unselected word lines. The row decoder 12 may be connected in common to the plurality of memory blocks BLK0 to BLKn and may provide driving signals (e.g., the word line voltages) to the word lines of a memory block (one of BLK0 to BLKn) that is selected by a block selection signal.

The page buffer 14 may be connected to the memory cell array 20 through the bit lines to sense data stored in the memory cells and to write data to the memory cells. The page buffer 14 may be connected to the bit line selected by an address signal decoded from the column decoder 16. During a write or "program" operation, the page buffer 14 may temporarily store data that is to be stored in the memory cells. During a read operation, the page buffer 14 may sense data that is stored in the memory cells. For example, the page buffer 14 may act as a write driver circuit during a program operation and may act as a sense amplifier circuit during a read operation. The page buffer 14 may receive a power (e.g., a voltage or a current) from the control circuit 18 and may provide the received power to the selected bit line.

The column decoder 16 may provide a data transmission path between the page buffer 14 and an external device (e.g., a memory controller). The column decoder 16 may decode the address signal that is input from the external device to select one of the bit lines. The column decoder 16 may be connected in common to the memory blocks BLK0 to BLKn and may provide data to the bit lines of the memory block (one of BLK0 to BLKn) that is selected by the block selection signal.

The control circuit 18 may control overall operations of the semiconductor memory device. The control circuit 18 may receive control signals and an external voltage and may be operated in response to the received control signals. The control circuit 18 may include a voltage generator that generates voltages (e.g., a program voltage, a sensing voltage, and/or an erasing voltage) that are necessary to internal operations using the externally supplied voltage. The control circuit 18 may perform a sensing operation, a writing operation, and/or an erasing operation in response to the control signals.

Figure 2:
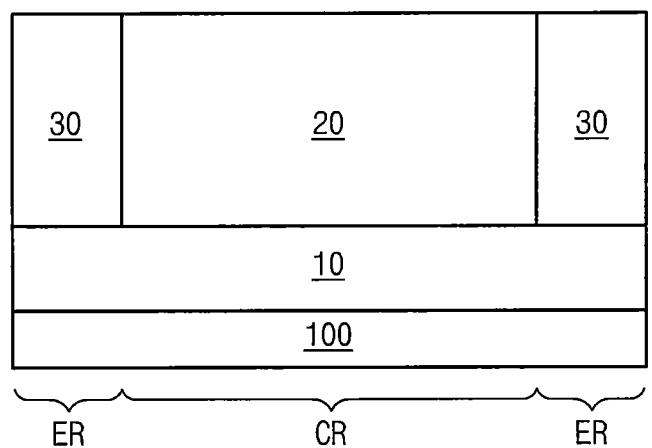
FIG. 2 is a cross-sectional view schematically illustrating an arrangement of components of a semiconductor memory device according to an embodiment of the inventive concepts.
Figure 3A:
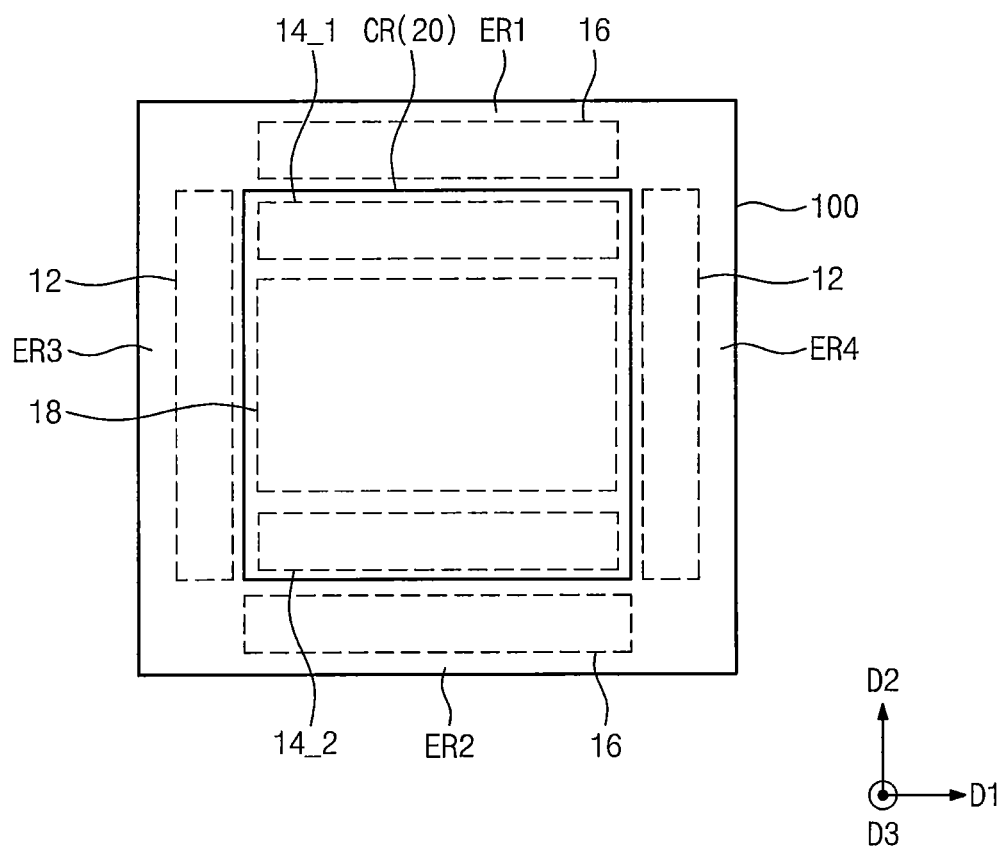
FIGS. 3A and 3B are plan views schematically illustrating arrangements of components of semiconductor memory devices according to embodiments of the inventive concepts.
Figure 3B:
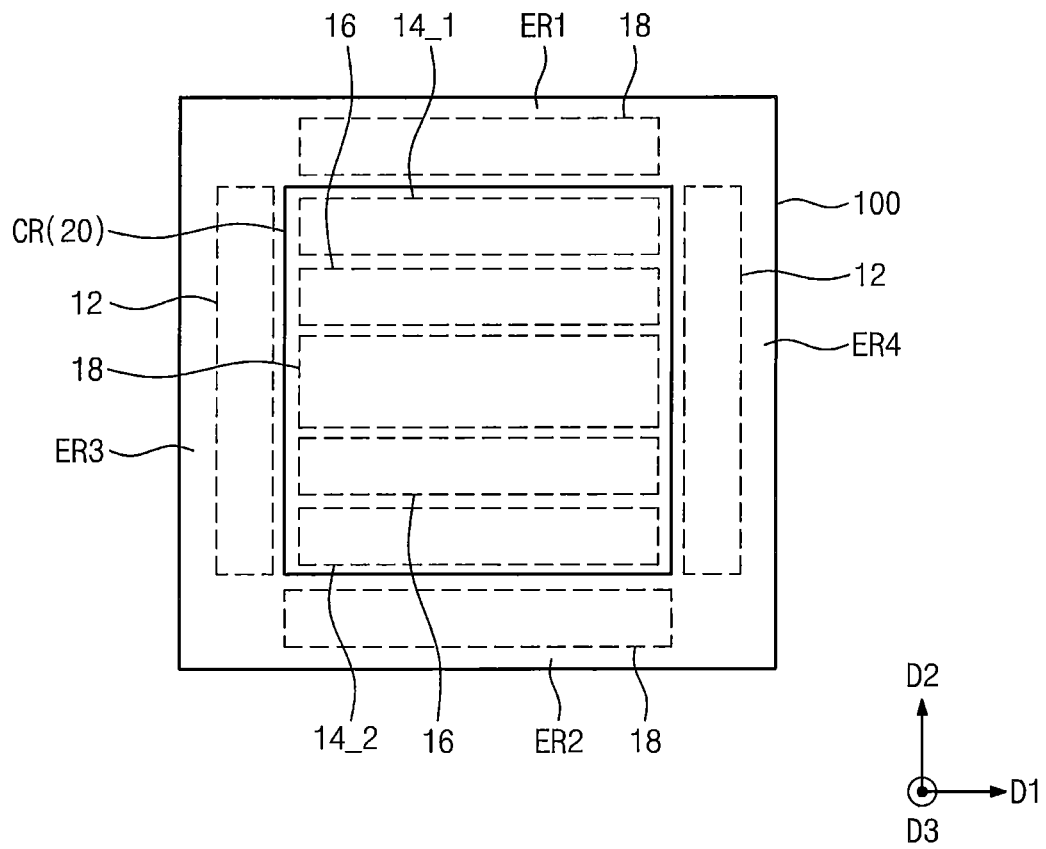

FIG. 2 is a cross-sectional view schematically illustrating an arrangement of components of a semiconductor memory device according to an embodiment of the inventive concepts. FIGS. 3A and 3B are plan views schematically illustrating arrangements of components of semiconductor memory devices according to embodiments of the inventive concepts.

Referring to FIGS. 2, 3A, and 3B, a semiconductor memory device may include a logic structure 10 disposed on a substrate 100, and a memory structure 20 disposed on the logic structure 10. The logic structure 10 may correspond to the control logic 10 of FIG. 1, and the memory structure 20 may correspond to the memory cell array 20 of FIG. 1.

The substrate 100 may include a circuit region CR and a connection region ER that is adjacent one or more edges of the circuit region CR. The connection region ER may include first and second connection regions ER1 and ER2 that each extend parallel to a first direction D1 and third and fourth connection regions ER3 and ER4 that each extend perpendicular to the first direction D1 when viewed from a plan view. In other words, the third and fourth connection regions ER3 and ER4 may each extend in a direction that is be perpendicular to the directions in which the first and second connection regions ER1 and ER2 extend when viewed from a plan view. The circuit region CR may have first and second sides that are opposite each other in a second direction D2 and third and fourth sides that are opposite each other in the first direction D1, when viewed from a plan view. The first and second connection regions ER1 and ER2 may be adjacent the first and second sides of the circuit region CR, respectively, and the third and fourth connection regions ER3 and ER4 may be adjacent the third and fourth sides of the circuit region CR, respectively. Here, the first direction D1 may correspond to a direction in which the word lines (WL0 to WL3 of FIG. 4) extend, and the second direction D2 may correspond to a direction in which the bit lines (BL of FIG. 4) extend to intersect the word lines WL0 to WL3.

The logic structure 10 and the memory structure 20 may be sequentially stacked on the circuit region CR of substrate 100. In addition, the logic structure 10 may extend onto the connection region ER of the substrate 100. In other words, a portion of the row and column decoders 12 and 16, the page buffer 14 and the control circuit 18 constituting the logic structure 10 may be disposed on the circuit region CR, and another portion of the row and column decoders 12 and 16, the page buffer 14 and the control circuit 18 may be disposed on the connection region ER. In an embodiment, a portion of the logic structure 10 may be disposed on both the circuit region CR and the connection region ER.

According to an embodiment of the inventive concepts, the page buffer 14 of FIG. 1 may be divided into two portions. The two portions of the page buffer 14 may be adjacent the respective first and second sides of the circuit region CR, and hence may be opposite each other in the second direction D2. In other words, the page buffer 14 may include a first page buffer 14_1 that is adjacent the first connection region ER1 and a second page buffer 14_2 that is adjacent the second connection region ER2. The first and second page buffers 14_1 and 14_2 may vertically overlap the circuit region CR. As used herein, a first element "vertically overlaps" a second element if an imaginary line that is perpendicular to a major face of the substrate on which the elements are provided intersects both the first element and the second element. FIGS. 3A and 3B illustrate the first and second page buffers 14_1 and 14_2 vertically overlapping only the circuit region CR and not the connection region ER. However, the inventive concepts are not limited thereto. For example, in other embodiments, a portion of the first page buffer 14_1 may also vertically overlap the first connection region ER1, and a portion of the second page buffer 14_2 may also vertically overlap the second connection region ER2.

Other components of the semiconductor memory device may also be variously arranged. For example, the control circuit 18 may be provided underneath the circuit region CR so as to vertically overlap with the memory structure 20, as illustrated in FIG. 3A. The row and column decoders 12 and 16 may be provided underneath the connection region ER and may not vertically overlap the memory structure 20. In the illustrated embodiments, the row decoder 12 is divided into two portions that are disposed underneath the third and fourth connection regions ER3 and ER4, respectively, and the column decoder 16 is divided into two portions that are disposed underneath the first and second connection regions ER1 and ER2, respectively. In some embodiments, as illustrated in FIG. 3B, the page buffer 14, the column decoder 16, and a portion of the control circuit 18 may be on the circuit region CR so as to vertically overlap with the memory structure 20. In addition, the row decoder 12 and other portions of the control circuit 18 may be on the first to fourth connection regions ER1 to ER4. Meanwhile, a connection structure 30 may be disposed on the logic structure 10 of the connection region ER. However, the inventive concepts are not limited thereto. In other embodiments, the connection structure 30 may be disposed on the circuit region CR, unlike the embodiment illustrated in FIG. 2.

In some embodiments, bit lines that are connected to the memory cells of the memory structure 20 may be electrically connected to the first and second page buffers 14_1, 14_2. For each pair of adjacent bit lines, the first bit line of the pair may be connected to the first page buffer 14_1, and the second bit line of the pair may be connected to the second page buffer 14_2. The bit lines may be arranged to satisfy the connection relation of the two bit lines described above. As a result, since the page buffer 14 and the bit lines have the arrangement and connection relations described above, it is possible to increase a design rule of connection conductive lines of the logic structure 20 which electrically connect the page buffer 14 to the bit lines. This is because the connection conductive lines are divided into respective groups corresponding to positions of the first and second page buffers 14_1, 14_2 of the page buffer 14. This will be described in more detail below with reference to semiconductor memory devices according to embodiments of the inventive concepts.

In addition, the above mentioned relationships among the page buffer 14, the bit lines and the connection conductive lines that connect the page buffer 14 to the bit lines may be applied to other elements (e.g., word lines, or upper interconnections formed on the memory structure 20), other logic circuits (e.g., the decoders, the control circuit, or an input/output circuit for interfacing with an external device) connected to the other elements, and other connection conductive lines connecting the other elements to the other logic circuits.

Each of the memory cells of the memory structure 20 may include a charge storage-type memory element (e.g., a flash memory device), or a variable resistance-type memory element (e.g., a phase-change random access memory (PRAM), a resistive random access memory (ReRAM) or a magnetic random access memory (MRAM)). In some embodiments, the memory cells may have a NAND array structure. However, the inventive concepts are not limited thereto. In other embodiment, the memory cells may have another array structure (e.g., a NOR array structure or an AND array structure).

Figure 4:
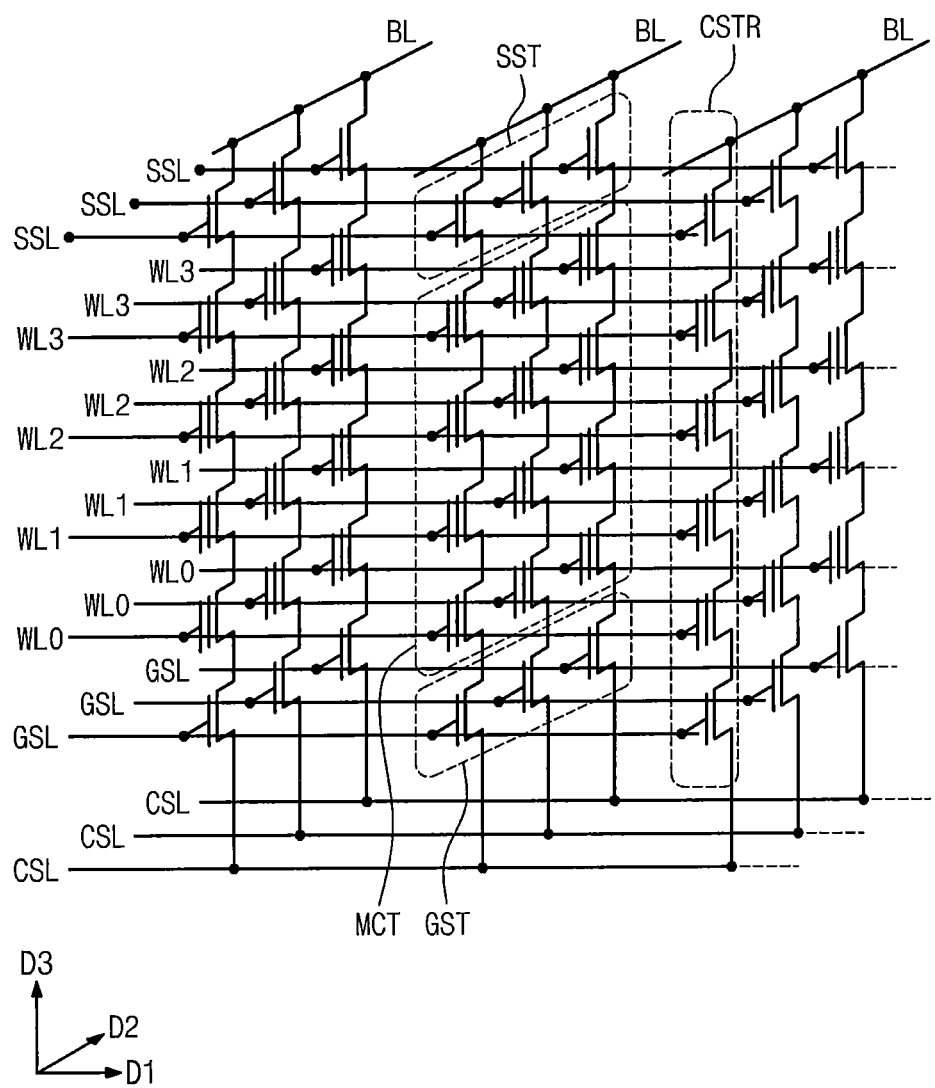
FIG. 4 is a circuit diagram illustrating an embodiment of a memory structure included in a semiconductor memory device according to an embodiment of the inventive concepts.

FIG. 4 is a circuit diagram illustrating an embodiment of a memory structure that may be included in semiconductor memory devices according to some embodiments of the inventive concepts.

Referring to FIG. 4, the memory structure of the semiconductor memory device may include at least one common source line CSL, a plurality of bit lines BL, and a plurality of cell strings CSTR that are disposed between the common source line CSL and the bit lines BL.

The bit lines BL may be two-dimensionally arranged. A plurality of cell strings CSTR may be connected in parallel to each of the bit lines BL. The cell strings CSTR may be connected in common to the common source line CSL. In other words, cell strings CSTR may be disposed between one of the common source lines CSL and multiple of the bit lines BL. In some embodiments, a plurality of common source lines CSL may be provided. In such embodiments, the common source lines CSL may be two-dimensionally arranged. In such embodiments, the same voltage may be applied to all of the common source lines CSL or, alternatively, the common source lines CSL may be electrically controlled independently of each other.

Each of the cell strings CSTR may include a ground selection transistor GST that is connected to the corresponding common source line CSL, a string selection transistor SST that is connected to the corresponding bit line BL, and a plurality of memory cell transistors MCT that are disposed between the ground and string selection transistors GST and SST. The ground selection transistor GST, the memory cell transistors MCT, and the string selection transistor SST may be electrically connected in series to each other.

The common source line CSL may be connected in common to sources of the ground selection transistors GST. A ground selection line GSL, a plurality of word lines WL0 to WL3 and a string selection line SSL, which are disposed between the common source line CSL and the bit lines BL, may be used as gate electrodes of the ground selection transistor GST, the memory cell transistors MCT and the string selection transistor SST, respectively. Each of the memory cell transistors MCT may include a data storage element.

Figure 5A:
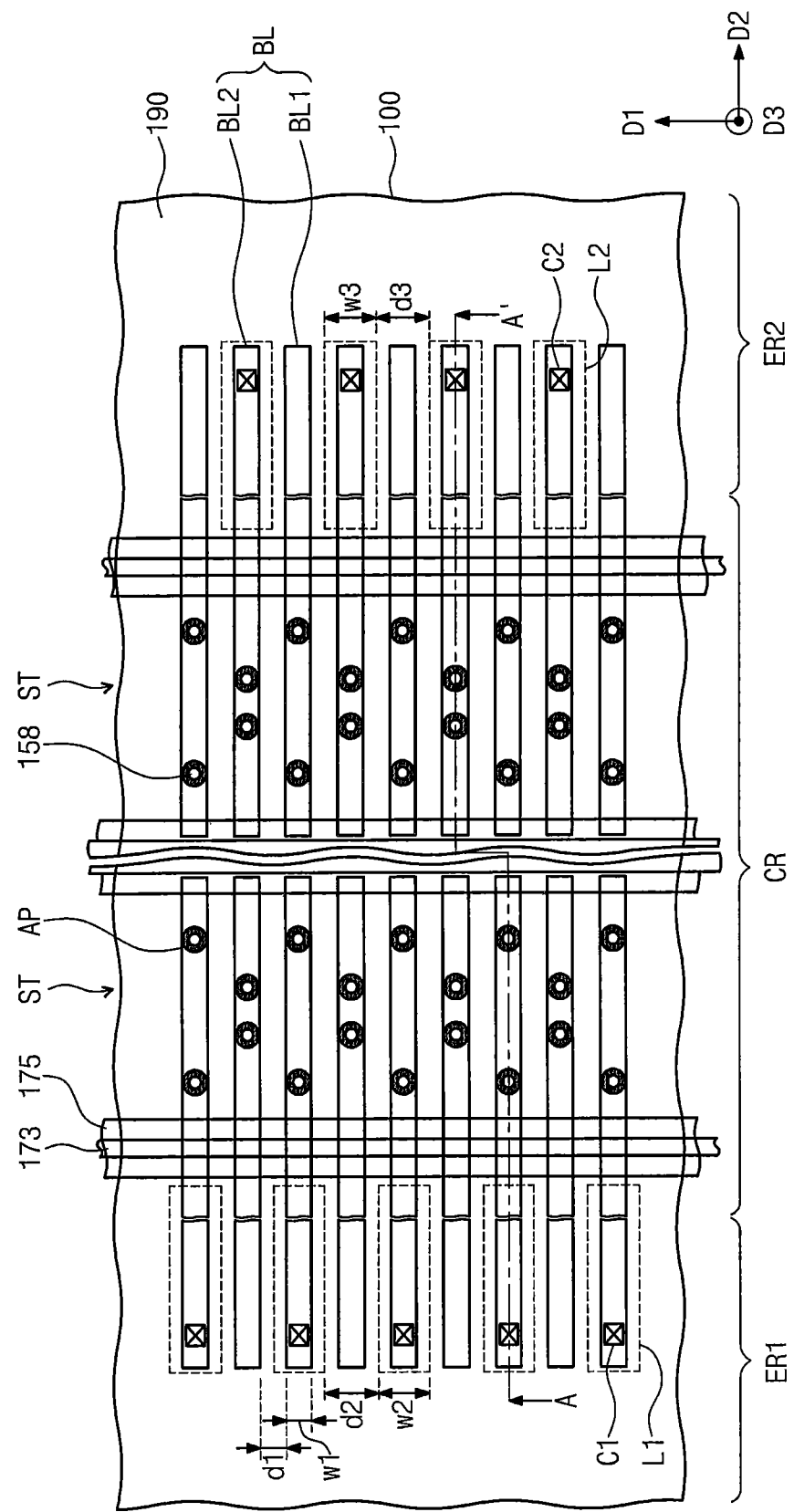
FIG. 5A is a plan view illustrating a semiconductor memory device according to an embodiment of the inventive concepts.
Figure 5B:
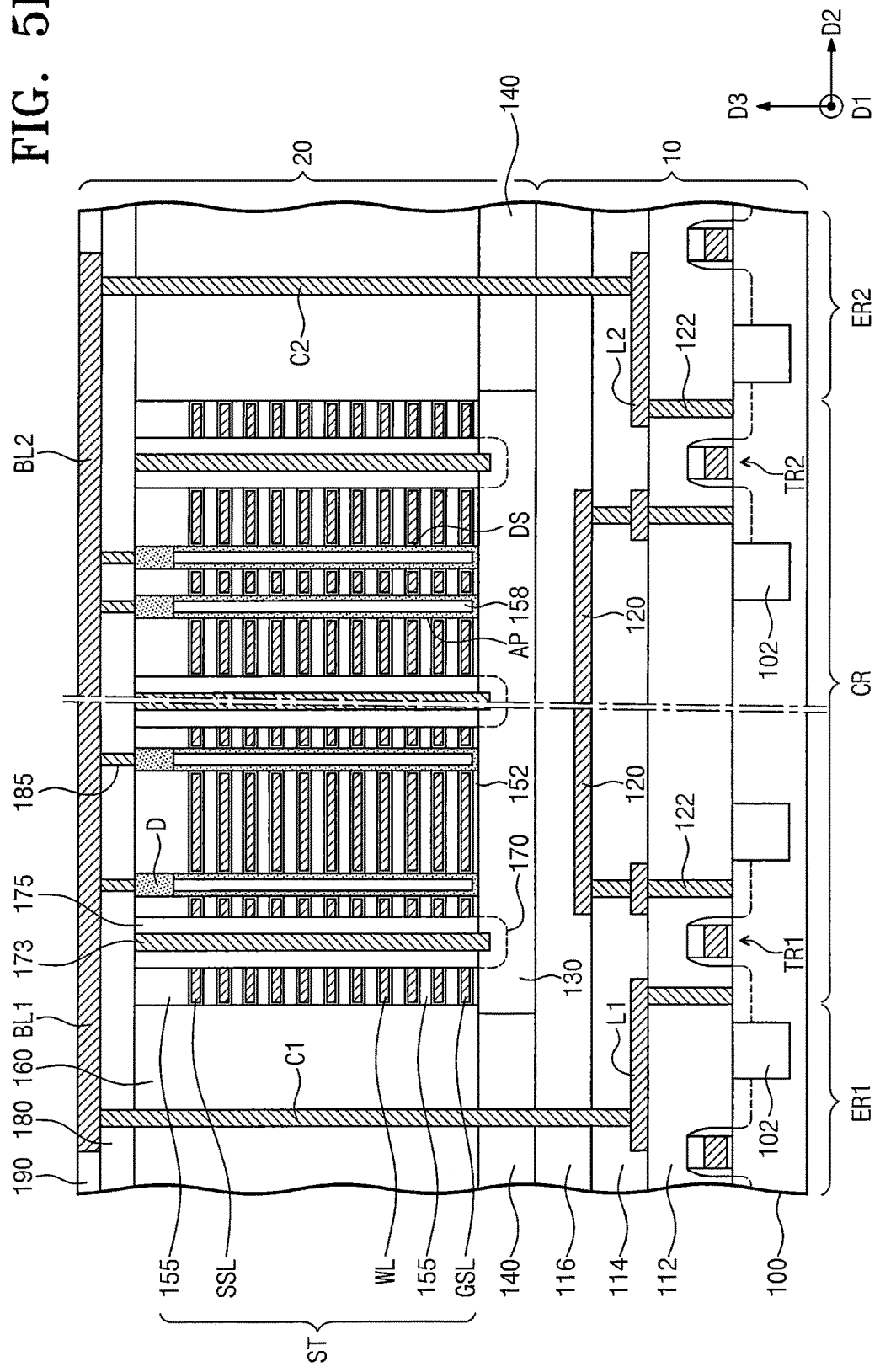
FIG. 5B is a cross-sectional view taken along line A-A' of FIG. 5A.
Figure 5C:
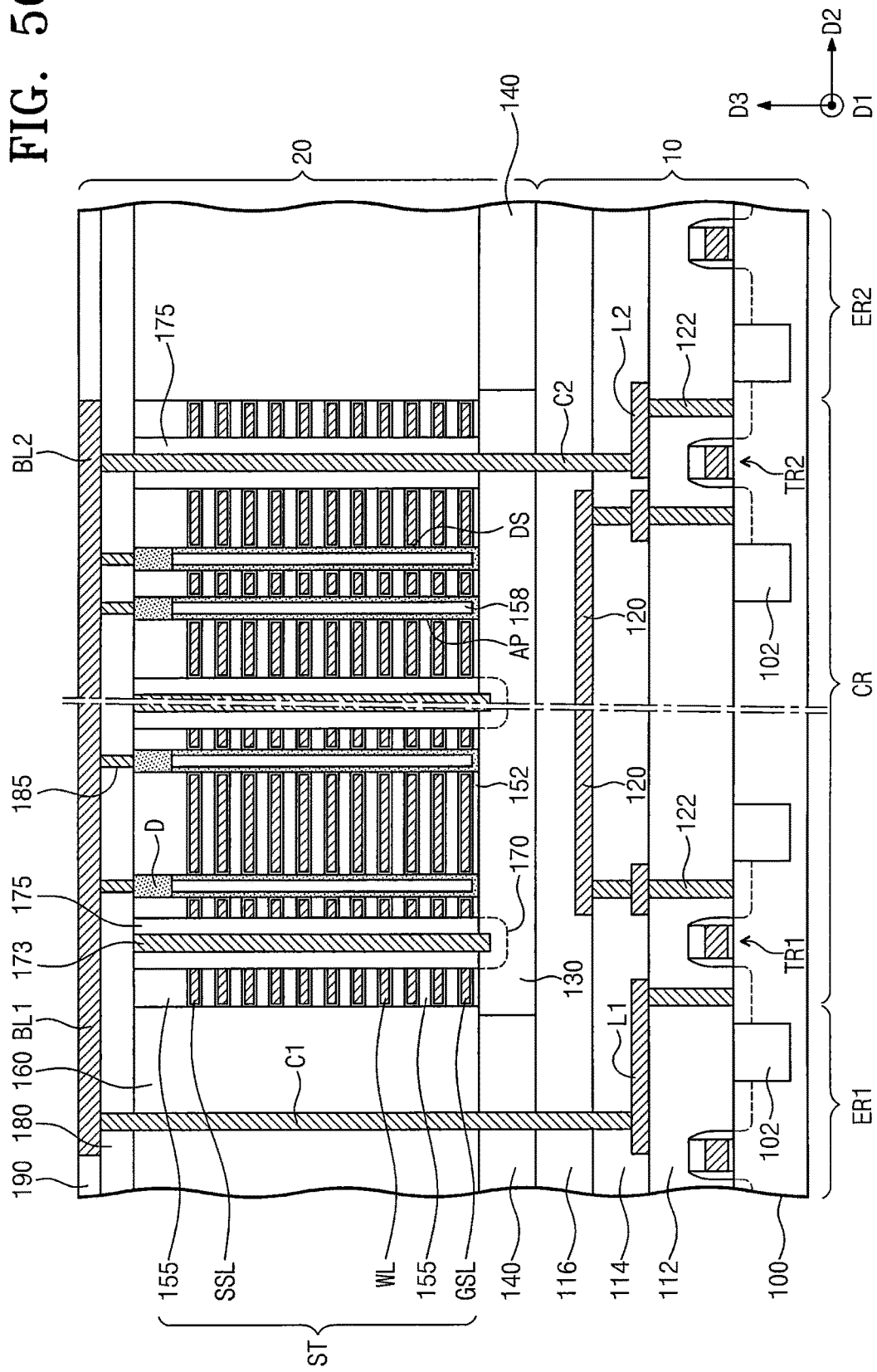
FIG. 5C is a cross-sectional view corresponding to the line A-A' of FIG. 5A to illustrate a modified embodiment of a semiconductor memory device according to an embodiment of the inventive concepts.

FIG. 5A is a plan view illustrating a semiconductor memory device according to an embodiment of the inventive concepts. FIG. 5B is a cross-sectional view taken along a line A-A' of FIG. 5A. FIG. 5C is a cross-sectional view corresponding to the line A-A' of FIG. 5A that illustrates a modified embodiment of the semiconductor memory device of FIG. 5A.

Referring to FIGS. 5A and 5B, a substrate 100 may be provided. The substrate 100 may include a circuit region CR and a connection region that is adjacent edges of the circuit region CR. The connection region may include the first connection region ER1 and the second connection region ER2 that are described above with reference to FIGS. 3A and 3B. In other words, the first and second connection regions ER1 and ER2 may be provided adjacent the respective sides of the circuit region CR that are opposite each other in the second direction D2. The third and fourth connection regions ER3 and ER4 that are described above with reference to FIGS. 3A and 3B are omitted from FIG. 5A to simplify the drawing and associated description, but it will be understood that the third and fourth connection regions ER3 and ER4 may be included in the semiconductor memory device of FIGS. 5A and 5B.

The substrate 100 may be a semiconductor substrate having a first conductivity type (e.g., a P-type). The semiconductor substrate may include, for example, at least one of a single-crystalline silicon layer, a silicon-on-insulator (SOI), a silicon layer formed on a silicon-germanium (SiGe) layer, a single-crystalline silicon layer formed on an insulating layer, or a poly-crystalline silicon layer formed on an insulating layer.

A logic structure 10 and a memory structure 20 may be sequentially stacked on the substrate 100. The logic structure 10 may include logic circuits such as the row and column decoders 12 and 16 of FIG. 1, the page buffer 14 of FIG. 1, and the control circuit 18 of FIG. 1. The logic circuits may be extend throughout the entire top surface of the substrate 100 (i.e., top surfaces of the circuit region CR and the connection region). In some embodiments, at least the page buffer 14 may be provided on the circuit region CR. The page buffer 14 may include the first page buffer 14_1 that is adjacent the first connection region ER1 and the second page buffer 14_2 that is adjacent the second connection region ER2, as described above with reference to FIGS. 3A and 3B. As shown in FIG. 5B, the first page buffer 14_1 may include a plurality of first logic transistors TR1 and the second page buffer 14_2 may include a plurality of second logic transistors TR2. It will be appreciated that only a few representative transistors are illustrated in FIG. 5B and that other elements of the logic structure 10 may also include transistors and other elements that are not shown in FIG. 5B. The first and second logic transistors TR1 and TR2 may be formed on active regions that are defined by a device isolation layer 102. In addition, the logic structure 10 may further include a plurality of first connection conductive lines L1 that are connected to the first logic transistors TR1 and a plurality of second connection conductive lines L2 that are connected to the second logic transistors TR2. The first connection conductive lines L1 extend onto the first connection region ER1, and the second connection conductive lines L2 extend onto the second connection region ER2. The first and second connection conductive lines L1 and L2 will be described in more detail below.

The logic structure 10 may further include lower interconnections 120, lower contacts 122, and a lower insulating layer. The lower interconnections 120 and the lower contacts 122 may be electrically connected to the logic circuits (e.g., the first and second logic transistors TR1 and TR2), and the lower insulating layer may cover the lower interconnections 120 and the lower contacts 122. The lower insulating layer may include first, second and third lower insulating layers 112, 114 and 116. However, the inventive concepts are not limited thereto. Each of the first to third lower insulating layers 112, 114 and 116 may include, for example, at least one of a silicon oxide layer, a silicon nitride layer, or a silicon oxynitride layer.

The memory structure 20 may be disposed on the third lower insulating layer 116 of the circuit region CR. The memory structure 20 may include a semiconductor layer 130, stack structures ST that are on the semiconductor layer 130, and active pillars AP that penetrate the stack structures ST.

The semiconductor layer 130 may not extend into the connection region. Consequently, portions of the third lower insulating layer 116 that are in the first and second connection regions ER1 and ER2 may be exposed by the semiconductor layer 130. The semiconductor layer 130 may include a single-crystalline silicon layer or a poly-crystalline silicon layer. The semiconductor layer 130 may have the first conductivity type (e.g., a P-type). A buffer insulating layer 152 may be provided between the semiconductor layer 130 and the stack structures ST. For example, the buffer insulating layer 152 may include a silicon oxide layer.

The stack structures ST may include insulating patterns 155 and electrodes that are alternately stacked on the buffer insulating layer 152. The electrodes may include a ground selection line GSL, word lines WL and a string selection line SSL which are sequentially stacked on the semiconductor layer 130 with the insulating patterns 155 therebetween. The insulating patterns 155 may include silicon oxide. The electrodes GSL, WL and SSL may include doped silicon, a metal (e.g., tungsten), a metal nitride, a metal silicide, or any combination thereof. The ground selection line GSL, the word lines WL, and the string selection line SSL may be electrically connected to the row decoder 12 that is described above with reference to FIG. 1. The row decoder 12 may apply a voltage to each of the ground selection line GSL, the word lines WL and the string selection line SSL. Nine word lines WL are illustrated in FIG. 5B. However, the inventive concepts are not limited thereto. The number of the word lines WL may be smaller or larger than nine.

One end (e.g., a bottom end) of each of the active pillars AP may be physically and/or electrically connected to the semiconductor layer 130. The active pillars AP may be arranged in columns that extend in a first direction (direction D1 in FIG. 5A). In some embodiments, the active pillars AP may be arranged in a zigzag pattern when viewed from a plan view. Alternatively, the active pillars AP may be arranged in rows and columns that form a matrix when viewed from a plan view. Each of the active pillars AP may include a semiconductor pattern. The semiconductor pattern may include silicon or silicon-germanium which is doped with dopants of the first conductivity type. Each of the active pillars AP may have a hollow cylindrical shape (e.g., a macaroni shape), so an inner hole may be defined in each of the active pillars AP. The inner hole of each of the active pillars AP may be filled with a filling insulation layer 158. The filling insulation layer 158 may be, for example, silicon oxide. A conductive pad D may be provided on a top end of each active pillar AP. The conductive pad D may be a semiconductor material doped with dopants or may be another conductive material.

The memory structure 20 may further include a data storage element DS disposed between each of the active pillars AP and the electrodes GSL, WL and SSL. The data storage element DS may include a blocking insulating layer that is adjacent the electrodes GSL, WL and SSL, a tunnel insulating layer that is adjacent the active pillar AP, and a charge storage layer that is between the blocking insulating layer and the tunnel insulating layer.

The blocking insulating layer may include a hafnium oxide layer, an aluminum oxide layer, and/or a silicon oxide layer. A stacking order of the hafnium oxide layer, the aluminum oxide layer and/or the silicon oxide layer may be variously modified. The tunnel insulating layer may include silicon oxide. The charge storage layer may include a charge trap layer or an insulating layer including conductive nano particles. The charge trap layer may include, for example, silicon nitride. Data stored in the data storage layer DS may be changed using Fowler-Nordheim tunneling that occurs in response to application of a voltage differential between the active pillar AP including the semiconductor pattern and the electrodes. Alternatively, the data storage element DS may include a thin layer capable of storing data based on another operating principle, e.g., a thin layer for a phase-change memory or a thin layer for a variable resistance memory.

A plurality of stack structures ST may be provided. Each stack structure ST may extend in the first direction D1 and the stack structures ST may be spaced apart from each other in a second direction D2 that intersects (e.g., is perpendicular to) the first direction D1. Common source regions 170 may be provided in the semiconductor layer 130 between adjacent ones of the stack structures ST. Each common source region 170 may extend in the first direction D1. The common source regions 170 may have a second conductivity type (e.g., an N-type). Common source plugs 173 may be provided between adjacent stack structures ST and may connect to respective ones of the common source regions 170. An isolation insulating layer 175 may be provided on either side of each common source plug 173 to isolate each common source plug from the stack structures ST adjacent thereto. A ground voltage may be applied to the common source regions 170 through the common source plugs 173 during a sensing or program operation of the semiconductor memory device. In some embodiments, each common source plug 173 may extend in the first direction D1 and may have a substantially uniform upper width in the second direction. In such embodiments, the isolation insulating layer 175 may have a spacer shape and may be on a sidewall of each of the stack structures ST. In other words, the isolation insulating layers 175 that are provided between adjacent stack structures ST may face each other with the common source plug 173 therebetween. In other embodiments, the isolation insulating layer 175 may fill a space between adjacent stack structures ST, and the common source plug 173 (or a plurality of common source plugs 173) may have a pillar shape and may penetrate the isolation insulating layer 175 so as to be locally connected to the common source region 170.

A first upper insulating layer 140 may be provided on the first and second connection regions ER1 and ER2 to cover a sidewall of the semiconductor layer 130 and an exposed top surface of the third lower insulating layer 116. A second upper insulating layer 160 may be provided on the first upper insulating layer 140 to cover outer sidewalls of the stack structures ST. While not shown in the drawings, end portions of the electrodes GSL, WL and SSL of the stack structure ST may have a stepped structure.

A third upper insulating layer 180 may be provided on the stack structures ST and the second upper insulating layer 160, and a fourth upper insulating layer 190 may be provided on the third upper insulating layer 180. Bit line contacts 185 may penetrate the third upper insulating layer 180. Bit lines BL may be provided in the fourth upper insulating layer 190. The bit lines BL may be electrically connected to the active pillars AP through the bit line contacts 185 and the conductive pads D. Each of the first to fourth upper insulating layers 140, 160, 180 and 190 may include at least one of a silicon oxide layer, a silicon nitride layer, or a silicon oxynitride layer.

According to an embodiment of the inventive concepts, a first pair of adjacent bit lines BL may be electrically connected to the first page buffer 14_1, and a second pair of adjacent bit lines BL may be electrically connected to the second page buffer 14_2. In other words, the bit lines BL may be arranged in pairs where each pair includes a first bit line BL1 and a second bit line BL2 that are adjacent each other. The first bit lines BL1 are electrically connected to the first page buffer 14_1 and the second bit lines BL2 are electrically connected to the second page buffer 14_2. The bit lines BL may be configured such that the first bit lines BL1 and the second bit lines BL2 are alternately and repeatedly arranged along the first direction D1.

End portions of the first bit lines BL1 may extend onto the first connection region ER1 and may or may not extend onto the second connection region ER2. The first bit lines BL1 may be electrically connected to the first logic transistors TR1 of the first page buffer 14_1 through first connection contacts C1 and the first connection conductive lines L1. On the first connection region ER1, each of the first connection conductive lines L1 may vertically overlap a corresponding one of the first bit lines BL1. The first connection contacts C1 may be disposed on the first connection region ER1 and may penetrate the first to third upper insulating layers 140, 160 and 180 and the second and third lower insulating layers 114 and 116. In some embodiments, first ends of the first connection contacts C1 may directly contact respective ones of the first bit lines BL1, and second ends of the first connection contacts C1 may directly contact respective ones of the first connection conductive lines L1.

Likewise, end portions of the second bit lines BL2 may extend onto the second connection region ER2 and may or may not extend onto the first connection region ER1. The second bit lines BL2 may be electrically connected to the second logic transistors TR2 of the second page buffer 14_2 through second connection contacts C2 and the second connection conductive lines L2. On the second connection region ER2, each of the second connection conductive lines L2 may vertically overlap a corresponding one of the second bit lines BL2. The second connection contacts C2 may be disposed on the second connection region ER2 and may penetrate the first to third upper insulating layers 140, 160 and 180 and the second and third lower insulating layers 114 and 116. In some embodiments, first ends of the second connection contacts C2 may directly contact respective ones of the second bit lines BL2, and second ends of the second connection contacts C2 may directly contact respective ones of the second connection conductive lines L2. The connection structure 30 described with reference to FIGS. 2, 3A and 3B may include the first and second connection contacts C1 and C2.

The bit lines BL may have substantially the same width and may be spaced apart from each other by substantially equal distances. For example, each of the bit lines BL may have a first width w1, and adjacent bit lines BL may be spaced apart from each other by a first distance d1. In other words, the bit lines BL may have a first pitch defined as a sum of the first width w1 and the first distance d1. First end portions of the bit lines BL may be aligned with each other along the first direction D1 on the first connection region ER1, and second end portions of the bit lines BL may be aligned with each other along the first direction D1 on the second connection region ER2. In the present embodiment, both end portions (i.e., the first and second end portions) of each of the bit lines BL may extend onto the first and second connection regions ER1 and ER2, respectively. However, the inventive concepts are not limited thereto. In other embodiments, one end portion of each of the first bit lines BL1 may not extend onto the first connection region ER1, and/or one end portion of each of the second bit lines BL2 may not extend onto the second connection region ER2. For example, as shown in FIG. 5C, in another example embodiment one end portion (the left end portion) of each of the second bit lines BL2 may extend onto the first connection region ER1, but the other end portion of each of the second bit lines BL2 may not extend onto the second connection region ER2. In such an embodiment, the second connection conductive lines L2 may not extend onto the second connection region ER2. In this case, the second bit lines BL2 may be electrically connected to the second connection conductive lines L2 through second connection contacts C2 that penetrate the isolation insulating layer 175 that is disposed between adjacent stack structures ST. In other words, the second connection contacts C2 may penetrate the third upper insulating layer 180, the isolation insulating layer 175, the semiconductor layer 130, the third lower insulating layer 116, and the second lower insulating layer 114 on the circuit region CR. Even though not shown in the drawings, if one end portion of each of the first bit lines BL1 extends onto the second connection region ER2 but the other end portion of each of the first bit lines BL1 does not extend onto the first connection region ER1, the first bit lines BL1 may be electrically connected to the first connection conductive lines L1 through first connection contacts C1 that are disposed between adjacent stack structures ST.

Referring again to FIGS. 5A and 5B, according to embodiments of the inventive concepts, a second distance d2 between adjacent ones of the first connection conductive lines L1 may be greater than the first distance d1 between adjacent ones of the bit lines BL. Likewise, a third distance d3 between adjacent ones of the second connection conductive lines L2 may be greater than the first distance d1 between adjacent ones of the bit lines BL. For example, each of the second and third distances d2 and d3 may be substantially equal to twice the first distance d1. In some embodiments, the second distance d2 may be substantially equal to the third distance d3. However, the inventive concepts are not limited thereto.

A width of each of the first and second connection conductive lines L1 and L2 may be greater than the first width w1 of the bit lines BL. In other words, each of the first connection conductive lines L1 may have a second width w2 that is greater than the first width w1, and each of the second connection conductive lines L2 may have a third width w3 that is greater than the first width w1. In some embodiments, each of the second and third widths w2 and w3 may be substantially equal to twice the first width w1. In other embodiments, each of the second and third widths w2 and w3 may be greater than twice the first width w1 and less than three times the first width w1. In some embodiments, the second width w2 may be substantially equal to the third width w3. However, the inventive concepts are not limited thereto. As a result, a second pitch of the first connection conductive lines L1 may be greater than the first pitch of the bit lines BL, and a third pitch of the second connection conductive lines L2 may be greater than the first pitch of the bit lines BL. In some embodiments, the second pitch may be substantially equal to the third pitch. Here, the second pitch of the first connection conductive lines L1 may be defined as a sum of the second width w2 and the second distance d2, and the third pitch may be defined as a sum of the third width w3 and the third distance d3.

It will also be appreciated the first and second bit lines BL1, BL2 and/or the first and second connection conductive lines L1, L2 need not have constant widths, as will be described in greater detail below. In such cases, an average width of one or more of the first connection conductive lines L1 may be greater than an average width of one or more of the first bit lines BL1, and/or an average width of one or more of the second connection conductive lines L2 may be greater than an average width of one or more of the second bit lines BL2. For bit lines (or connection conductive lines) that comprise multiple segments, where each segment has a constant width, the average width may be determined as the sum of the width of each segment multiplied by the length of the segment, which total is then divided by the number of segments. For example, if the bit line has a widened area at either end thereof that has a width of 3 microns, where each widened area is 2 microns in length, and a line portion connecting the two widened end portions, where the line portion has a width of 1 micron and a length of 20 microns, the average width for the bit line would be [(3*2)+(1*20)+(3*2)]/24=32/24=1.33.

The connection conductive lines L1 and L2 may have a physical property capable of preventing a process defect (e.g., a hillock defect) at the maximum temperature (hereinafter, referred to as "a process critical temperature") of processes for forming the memory structure 20 and/or the bit lines BL. In other word, the connection conductive lines L1 and L2 may be formed of conductive material(s) having a heat-resistance property at the process critical temperature. For example, the connection conductive lines L1 and L2 may include at least one material (e.g., tungsten) having a melting point that is higher than the process critical temperature. A resistivity of the conductive material of the bit lines BL may be lower than that of the conductive material of the connection conductive lines L1 and L2. For example, the conductive material of the bit lines BL may include a low resistivity material (e.g., copper or aluminum) that may cause the process defect at a temperature lower than the process critical temperature. Since the bit lines BL are formed after the memory structure 20, a low resistivity material having a low melting point may be used as the conductive material of the bit lines BL. The resistivity of the connection conductive lines L1 and L2 may be higher than that of the bit lines BL due to the above mentioned limitations of the manufacturing process. This may cause deterioration of electrical characteristics of the semiconductor memory device. However, according to embodiments of the inventive concepts, the page buffer 14 may be divided into the first and second page buffers 14_1 and 14_2 that are adjacent both sides of the memory structure 20, and thus it is possible to increase the widths of the connection conductive lines L1 and L2 that connect the bit lines BL to the page buffer 14. As a result, the resistance characteristics of the connection conductive lines L1 and L2 may be improved to improve the electrical characteristics of the semiconductor memory device.

In addition, since the widths of the connection conductive lines L1 and L2 are increased, it is possible to more easily arrange and form the connection contacts C1 and C2 that electrically connect the connection conductive lines L1 and L2 to the bit lines BL. As a result, it is possible to more easily realize a highly integrated semiconductor memory device.

A method of manufacturing a semiconductor memory device according to an embodiment of the inventive concepts will be described hereinafter. FIGS. 6A to 12A are plan views illustrating a method of manufacturing the semiconductor memory device. FIGS. 6B to 12B are cross-sectional views taken along lines A-A' of FIGS. 6A to 12A, respectively.

Figure 6A:
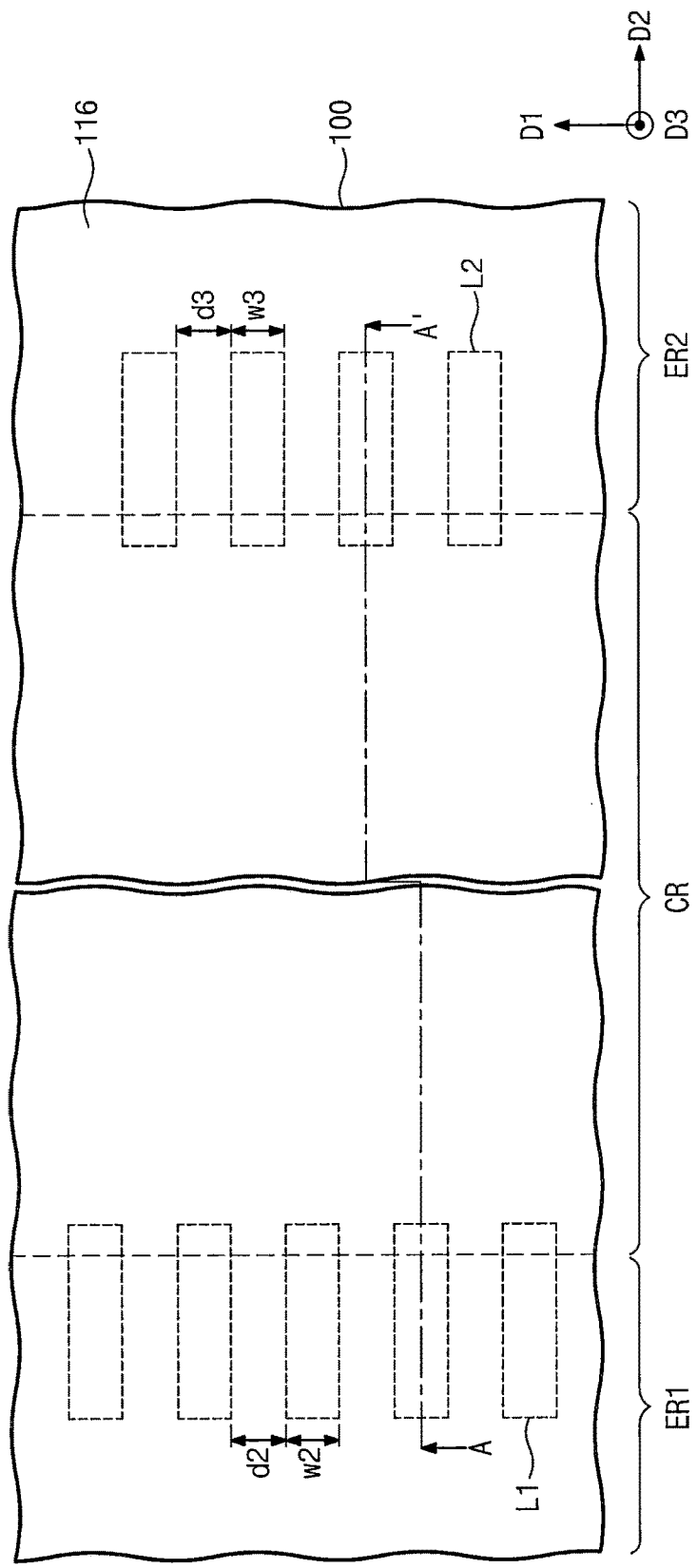
Figure 6B:
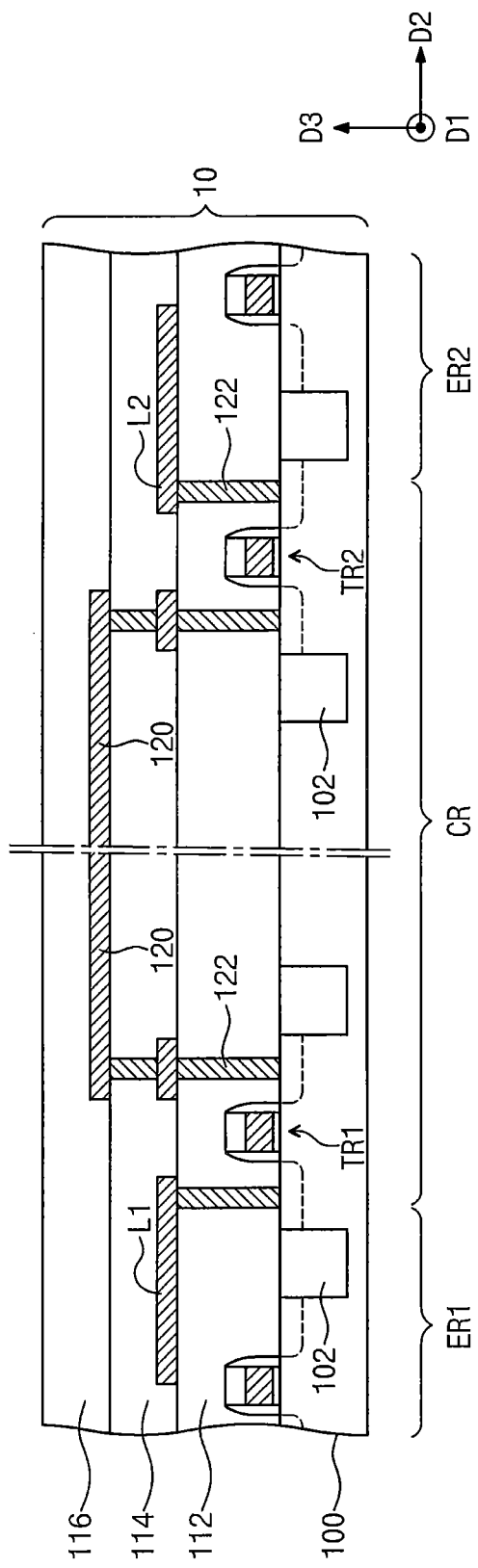

Referring to FIGS. 6A and 6B, a substrate 100 including a circuit region CR and a connection region may be provided. The connection region may include a first connection region ER1 and a second connection region ER2 which are provided on opposed sides of the circuit region CR. The substrate 100 may be a semiconductor substrate having a first conductivity type (e.g., a P-type). The semiconductor substrate 100 may include at least one of a single-crystalline silicon layer, a silicon-on-insulator (SOI), a silicon layer formed on a silicon-germanium (SiGe) layer, a single-crystalline silicon layer formed on an insulating layer, or a poly-crystalline silicon layer formed on an insulating layer.

A logic structure 10 may be formed on the substrate 100. The logic structure 10 may include a plurality of logic transistors that form a logic circuit. The logic transistors may be formed on active regions in the substrate 100 that are defined by a device isolation layer 102. On the circuit region CR, the logic transistors may include first logic transistors TR1 constituting a first page buffer 14_1 and second logic transistors TR2 constituting a second page buffer 14_2. The first logic transistors TR1 may be adjacent the first connection region ER1, and the second logic transistors TR2 may be adjacent the second connection region ER2. A lower insulating layer may be formed on the substrate 100 to cover the logic transistors. The lower insulating layer may include first, second and third lower insulating layers 112, 114 and 116. Each of the first to third lower insulating layers 112, 114 and 116 may include at least one of a silicon oxide layer, a silicon nitride layer, or a silicon oxynitride layer.

Lower interconnections 120 and lower contacts 122 may be formed in the lower insulating layer that are connected to the logic transistors TR1, TR2. In addition, first connection conductive lines L1 and second connection conductive lines L2 may be formed in the lower insulating layer. The first connection conductive lines L1 may be electrically connected to the first logic transistors TR1, and the second connection conductive lines L2 may be electrically connected to the second logic transistors TR2. The first connection conductive lines L1 may extend onto the first connection region ER1, and the second connection conductive lines L2 may extend onto the second connection region ER2. Each of the first connection conductive lines L1 may have a second width w2, and adjacent ones of the first connection conductive lines L1 may be spaced apart from each other by a second distance d2. Each of the second connection conductive lines L2 may have a third width w3, and adjacent ones of the second connection conductive lines L2 may be spaced apart from each other by a third distance d3. The first connection conductive lines L1 and the second connection conductive lines L2 may be arranged in patterns having pitches that are equal to or greater than the minimum pitch realized by a photolithography process. In other word, the first and second connection conductive lines L1 and L2 may be formed using a single-patterning technique. For example, a conductive layer may be formed on the first lower insulating layer 112, and the conductive layer may be patterned to form the first and second connection conductive lines L1 and L2. The conductive layer may include, for example, tungsten. In the present embodiment, the first and second connection conductive lines L1 and L2 are formed on the first lower insulating layer 112. However, embodiments of the inventive concepts are not limited thereto.

Figure 7A:
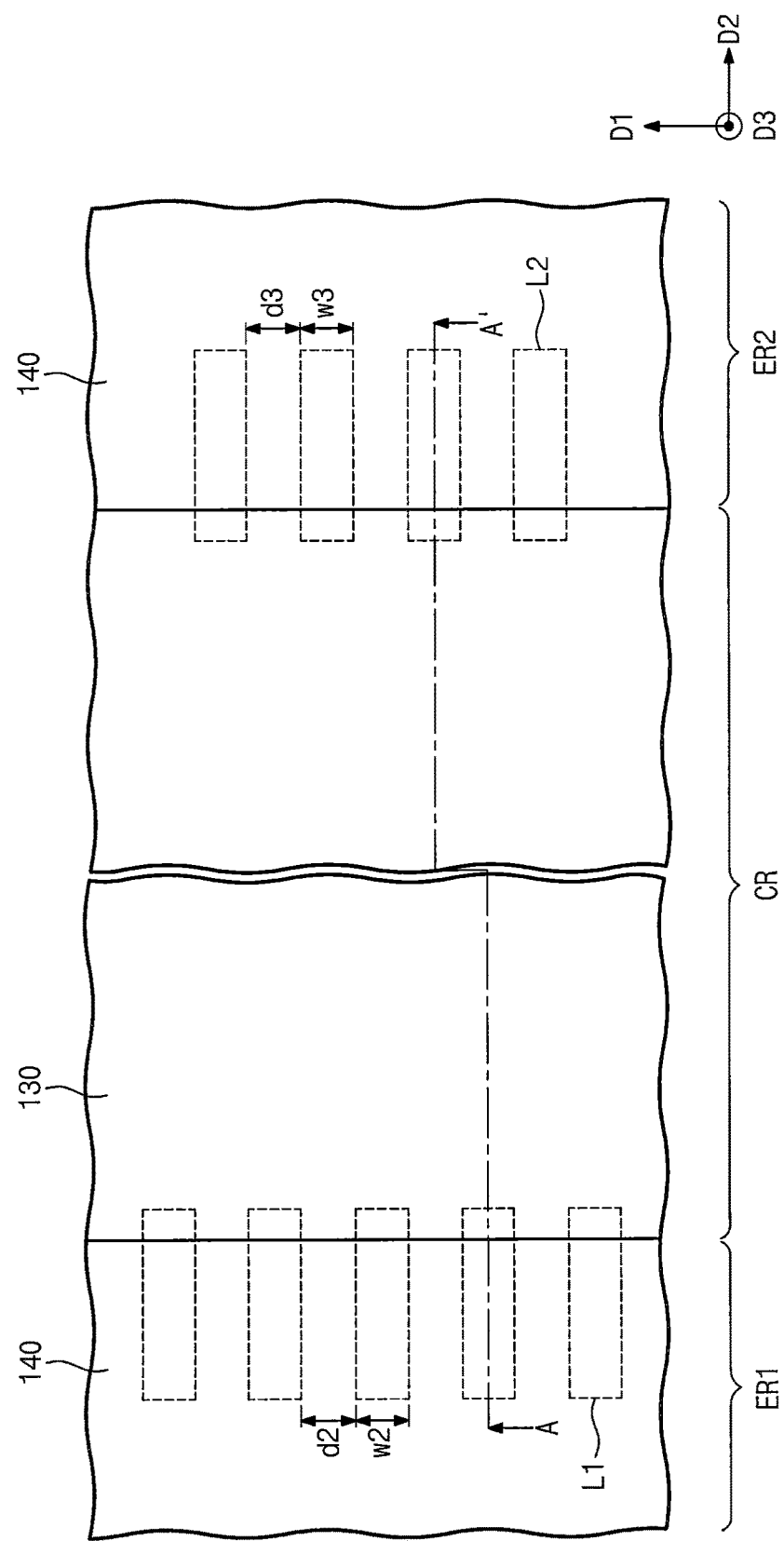
Figure 7B:
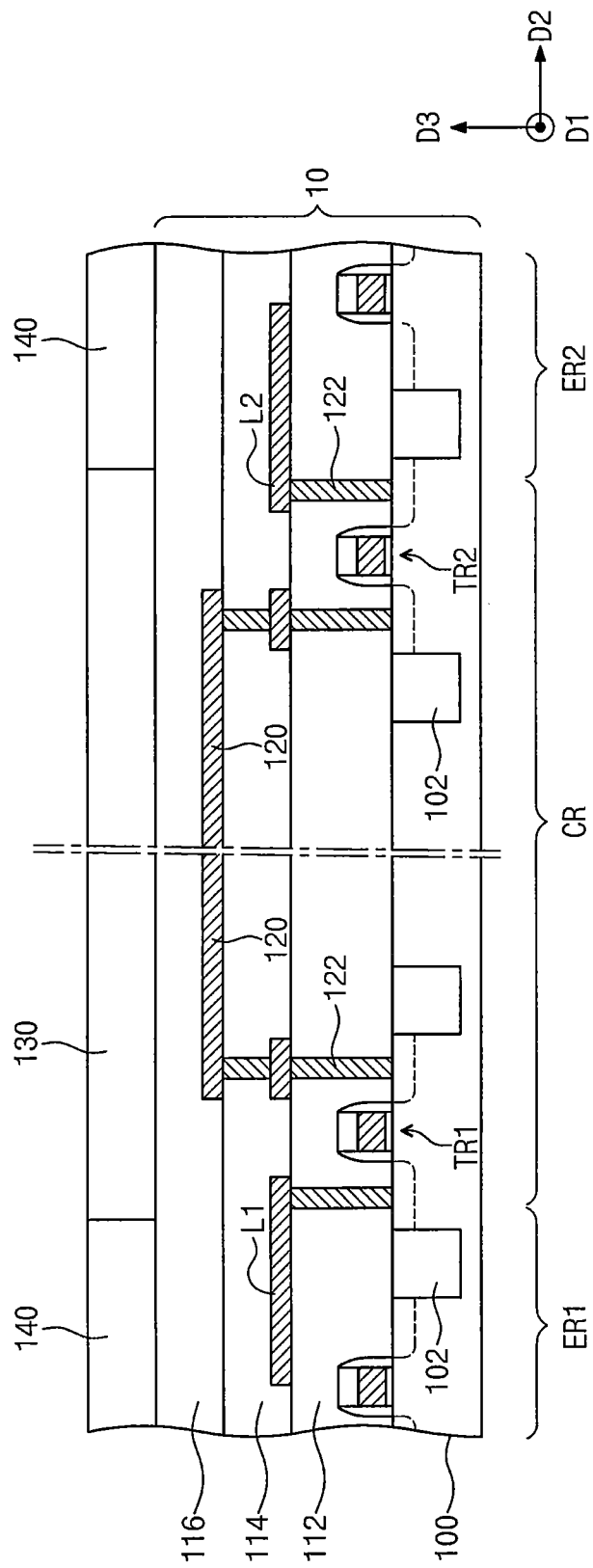

Referring to FIGS. 7A and 7B, a semiconductor layer 130 may be formed on the third lower insulating layer 116. In some embodiments, the semiconductor layer 130 may comprise a silicon epitaxial layer and may have a single-crystalline structure. In such embodiments, a contact hole (not shown) may be formed that penetrates the first to third lower insulating layers 112, 114 and 116. The contact hole may expose the substrate 100. The semiconductor layer 130 may be formed to fill the contact hole and to cover the third lower insulating layer 116 by a selective epitaxial growth (SEG) method or a solid phase epitaxial (SPE) method. Thereafter, the semiconductor layer 130 disposed in the contact hole may be removed, and then the contact hole may be filled with an insulating layer. In some embodiments, the semiconductor layer 130 may be a poly-crystalline silicon layer. The semiconductor layer 130 disposed on the first and second connection regions ER1 and ER2 may be removed to expose the third lower insulating layer 116. Next, a first upper insulating layer 140 may be formed on the third lower insulating layer 116 of the first and second connection regions ER1 and ER2 so as to cover sidewalls of the semiconductor layer 130.

Figure 8A:
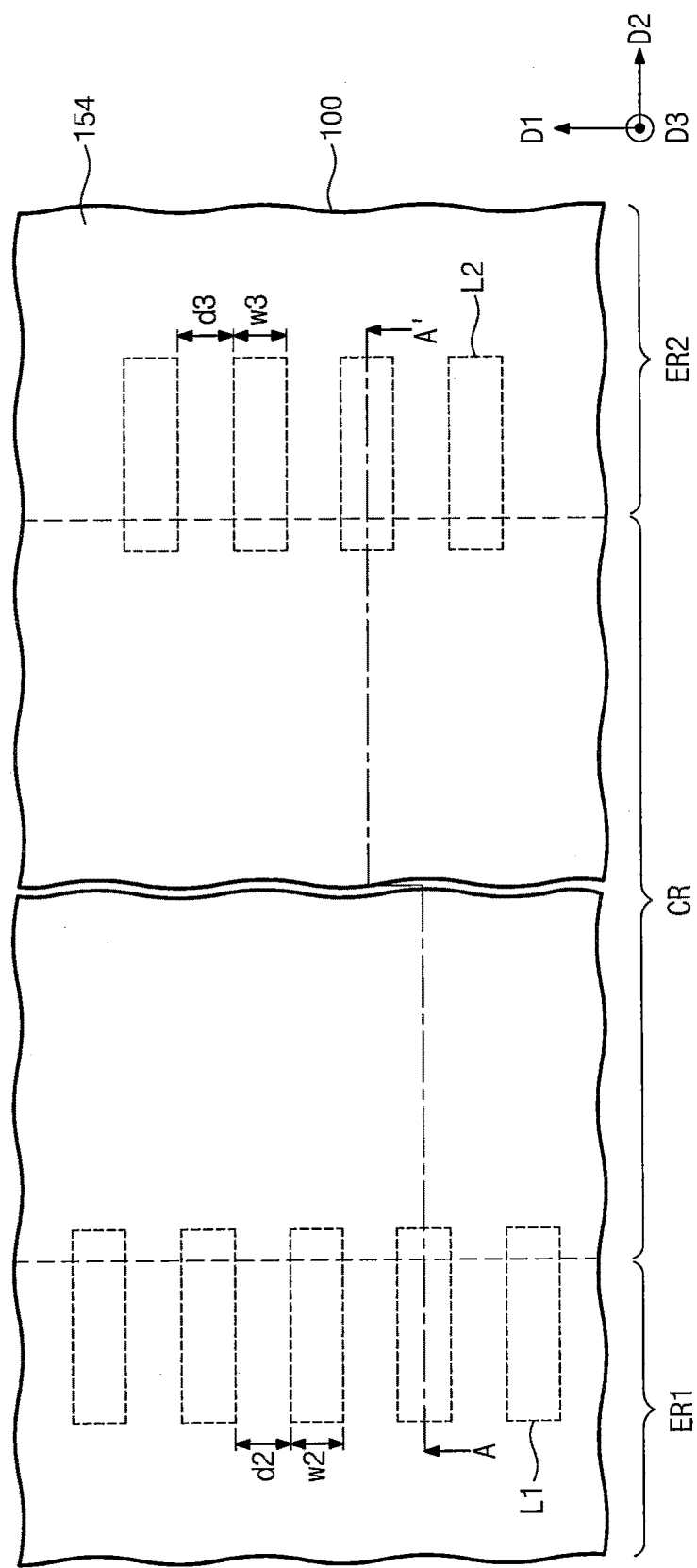
Figure 8B:
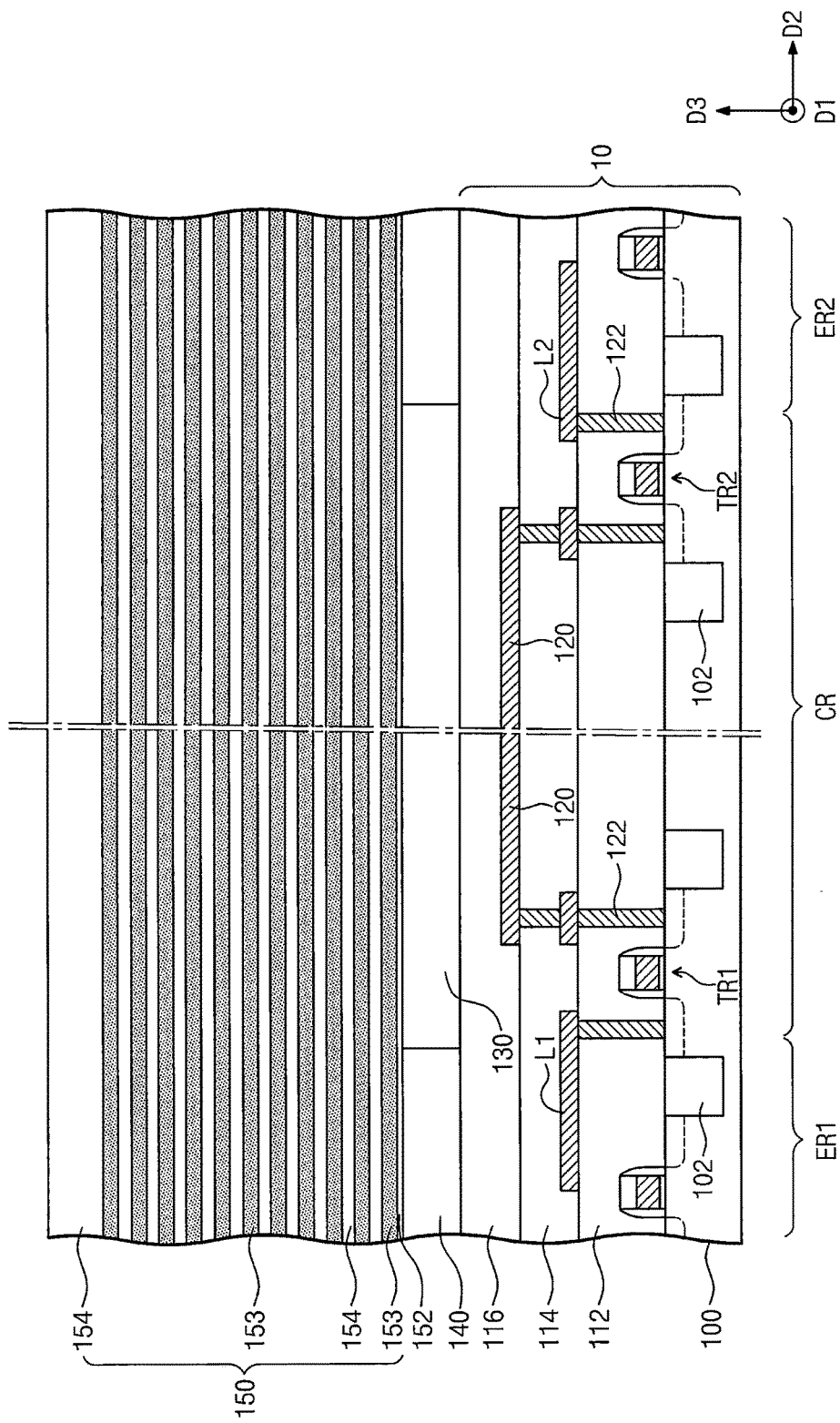

Referring to FIGS. 8A and 8B, a buffer insulating layer 152 may be formed on the semiconductor layer 130 and on the first upper insulating layer 140. For example, the buffer insulating layer 152 may include a silicon oxide layer. The buffer insulating layer 152 may be formed by, for example, a thermal oxidation process. A thin-layer structure 150 may be formed on the buffer insulating layer 152. The thin-layer structure 150 may include sacrificial layers 153 and insulating layers 154 which are alternately stacked on the buffer insulating layer 152. Each of the insulating layers 154 may include, for example, a silicon oxide layer. The sacrificial layers 153 may include a material having a wet etching characteristic that is different from the wet etching characteristics of the buffer insulating layer 152 and the insulating layers 154. Each of the sacrificial layers 153 may include, for example, a silicon nitride layer, a silicon oxynitride layer, a poly-crystalline silicon layer, or a poly-crystalline silicon-germanium layer. Each of the sacrificial layers 153 and insulating layers 154 may be formed by, for example, a chemical vapor deposition (CVD) method.

Referring to FIGS. 9A and 9B, vertical holes may be formed to penetrate the thin-layer structure 150 on the circuit region CR. The vertical holes may expose the semiconductor layer 130. Active pillars AP may be formed in the respective vertical holes. One end of each of the active pillars AP may be connected to the semiconductor layer 130. Each of the active pillars AP may include a semiconductor pattern. The semiconductor pattern may include silicon or silicon-germanium, which is doped with dopants of the first conductivity type. Each of the active pillars AP may have a hollow cylindrical shape (e.g., a macaroni shape), so an inner hole may be defined in each of the active pillars AP. The inner hole of each of the active pillars AP may be filled with a filling insulation layer 158. The insulating layers 154 and the sacrificial layers 153 disposed on the first and second connection regions ER1 and ER2 may be removed. Sidewalls of the insulating layers 154 and sacrificial layers 153 that are adjacent the first and second connection regions ER1 and ER2 are vertically aligned with each other in FIGS. 9A and 9B for the purpose of ease and convenience in illumination. However, the inventive concepts are not limited thereto. In particular, end portions of the insulating layers 154 and sacrificial layers 153 may have a stepped structure. A second upper insulating layer 160 may be formed on the first and second connection regions ER1 and ER2 to cover the sidewalls of the insulating layers 154 and sacrificial layers 153.

In the above descriptions, the semiconductor layer 130 was previously etched in the process described with reference to FIGS. 7A and 7B. However, the inventive concepts are not limited thereto. In other embodiments, the semiconductor layer 130 may be etched when the insulating layers 154 and the sacrificial layers 153 of the first and second connection regions ER1 and ER2 are removed. In this case, the first upper insulating layer 140 may be omitted, and the second upper insulating layer 160 may also cover the sidewalls of the semiconductor layer 130.

Figure 10A:
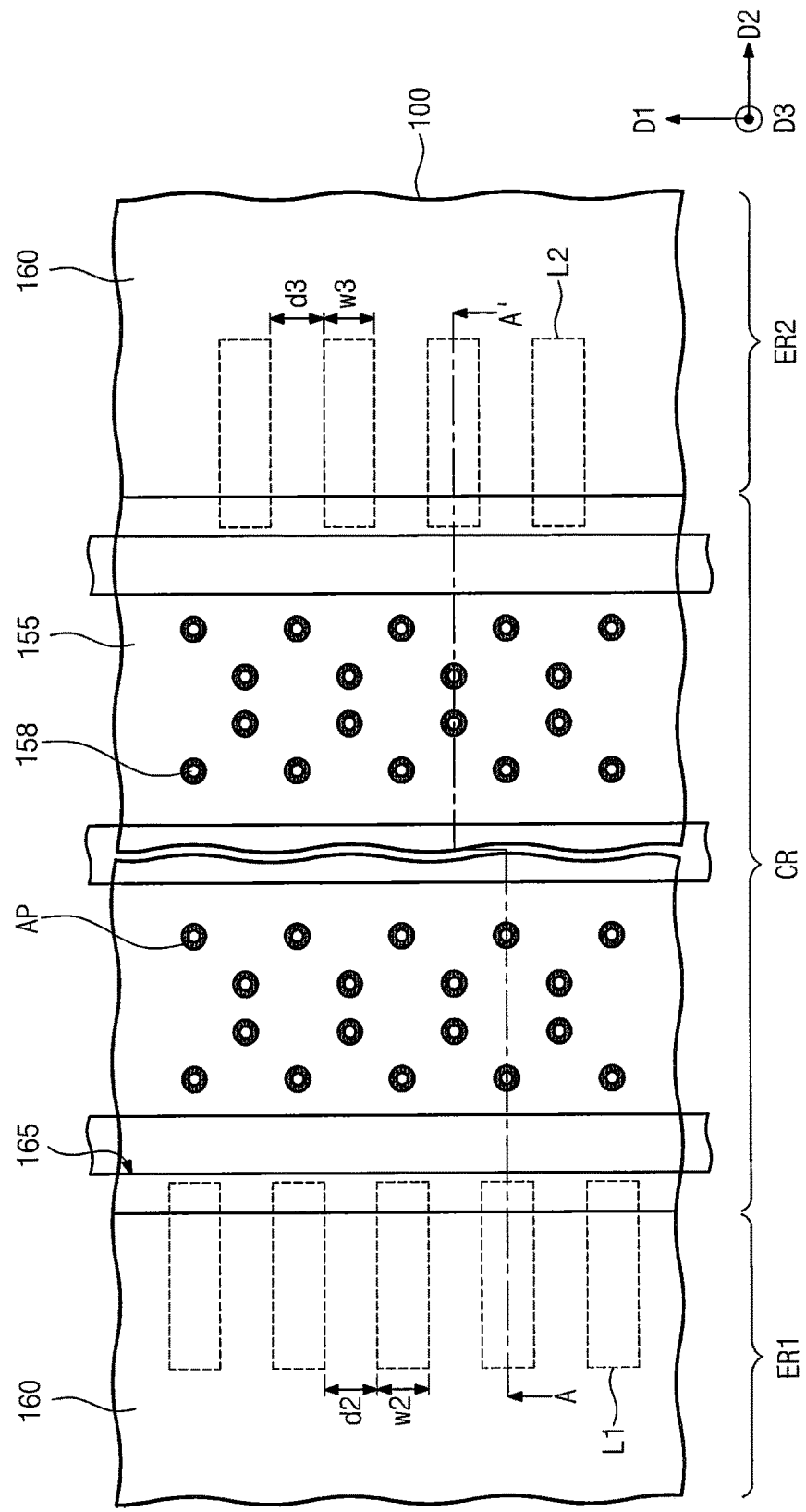
Figure 10B:
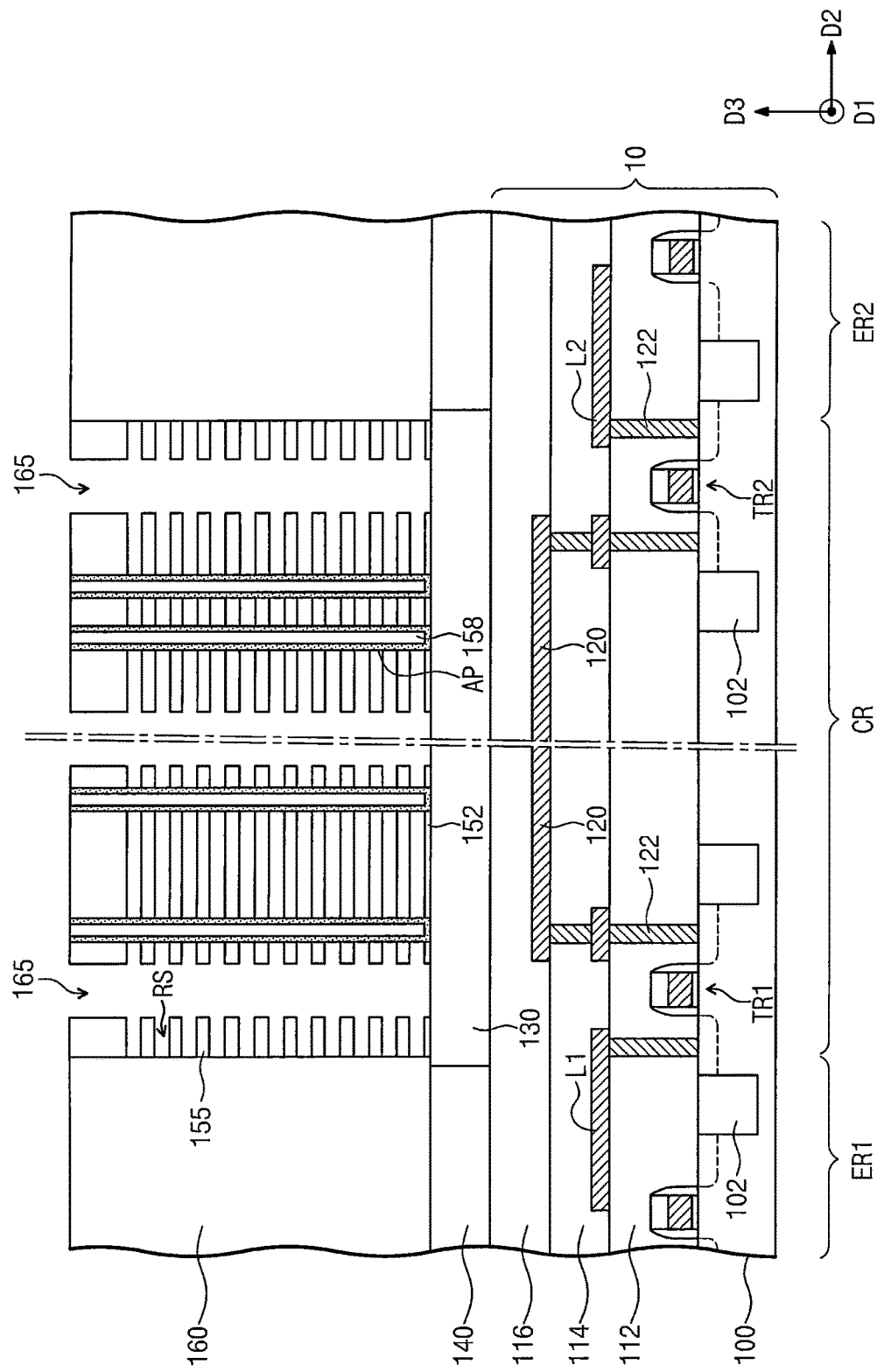

Referring to FIGS. 10A and 10B, the thin-layer structure 150 may be patterned to form trenches 165 that extend in the first direction D1. The trenches 165 may expose the semiconductor layer 130. The trenches 165 may divide the thin-layer structure 150 into segments that are separated from each other in the second direction D2. The patterned insulating layers 154 may be defined as insulating patterns 155.

The sacrificial layers 153 that are exposed by the trenches 165 may be selectively removed to form recess regions RS. The recess regions RS may correspond to empty regions that are formed by the removal of the sacrificial layers 153 and may be defined by the active pillars AP and the insulating patterns 155. If the sacrificial layers 153 include silicon nitride layers or silicon oxynitride layers, the sacrificial layers 153 may be removed using an etching solution including phosphoric acid.

Figure 11A:
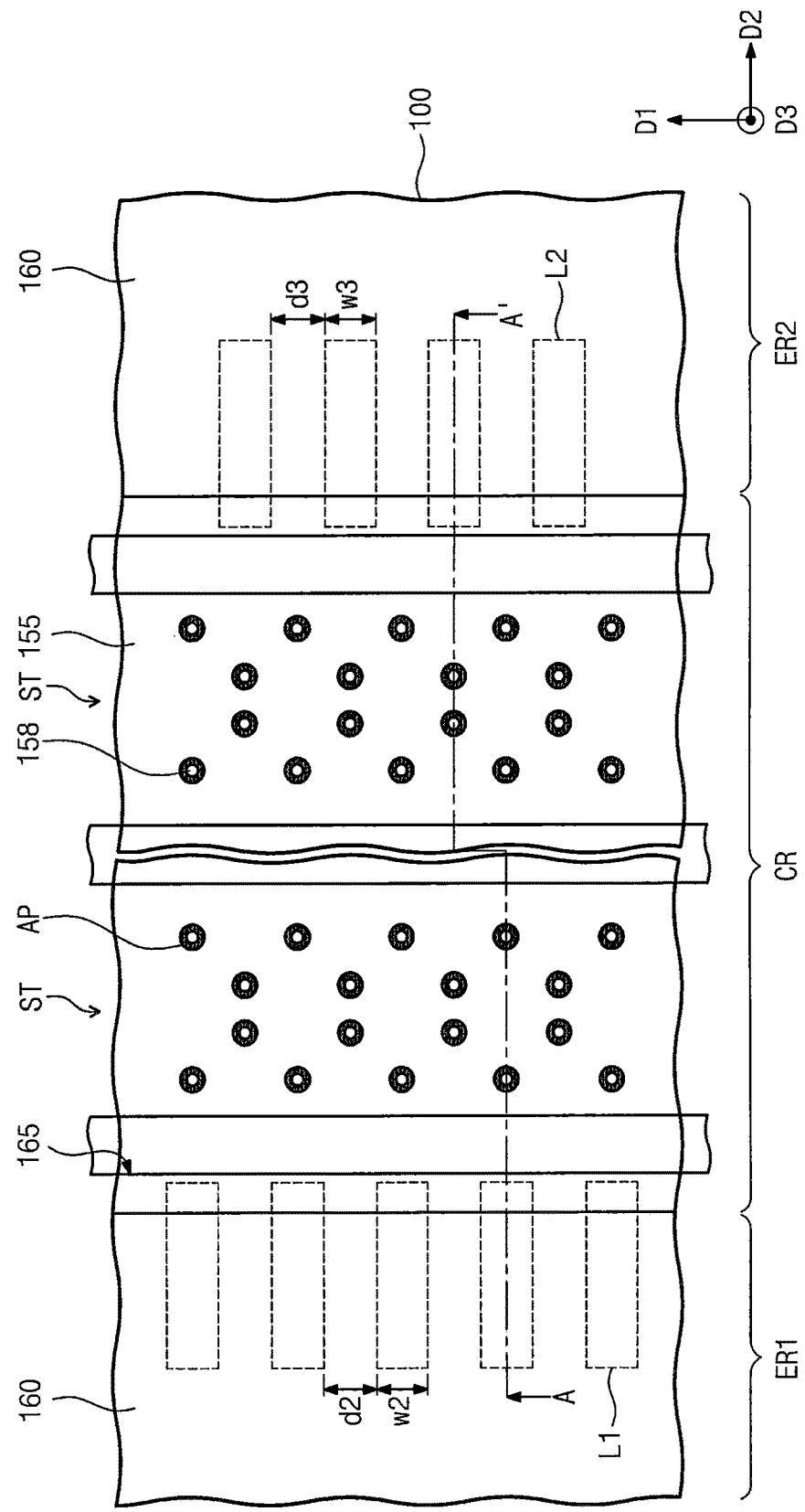
Figure 11B:
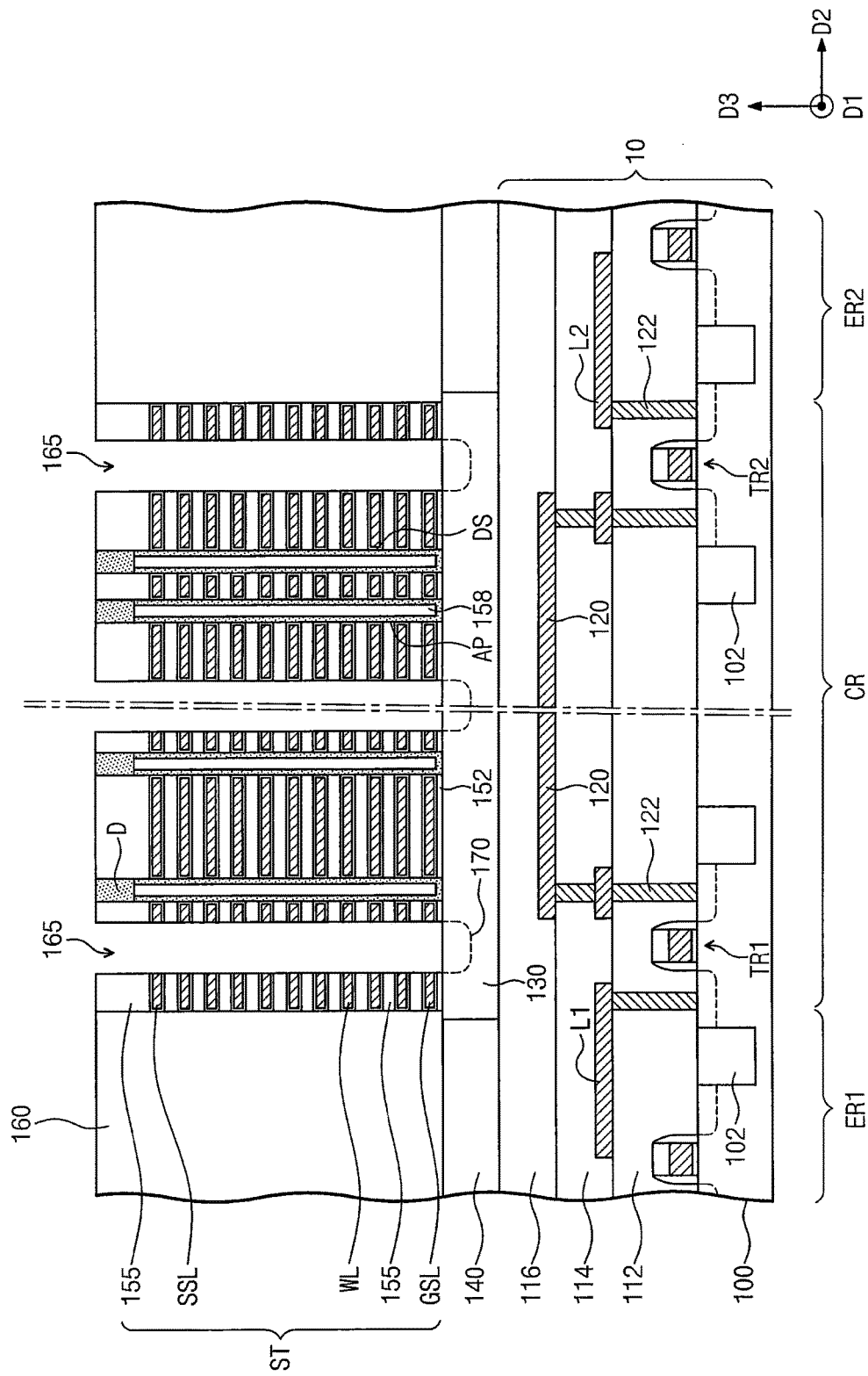

Referring to FIGS. 11A and 11B, a data storage element DS may be formed in each recess region RS through the trenches 165. The data storage element DS may include a blocking insulating layer, a tunnel insulating layer, and a charge storage layer that is disposed between the blocking insulating layer and the tunnel insulating layer. A conductive layer (not shown) may be formed to fill the recess regions RS having the data storage element DS. The conductive layer may be formed of at least one of a doped polycrystalline silicon layer, a metal layer (e.g., a tungsten layer), or a metal nitride layer. In an embodiment, the conductive layer may include a metal nitride layer and a metal layer disposed on the metal nitride layer. The conductive layer may be formed by, for example, an atomic layer deposition (ALD) method. At least a portion of the data storage element DS may be formed on sidewalls of the vertical holes before the formation of the active pillars AP in the process described with reference to FIGS. 9A and 9B.

Next, portions of the conductive layer that are outside the recess regions RS (e.g., in the trenches 165) may be removed to form electrodes GSL, WL and SSL in the respective recess regions RS and to expose the semiconductor layer 130. The insulating patterns 155 and the electrodes GSL, WL and SSL may constitute a stack structure ST. Dopant ions of a second conductivity type may be implanted into the exposed semiconductor layer 130 to form common source regions 170. Conductive pads D may be formed on top end portions of the active pillars AP.

Figure 12A:
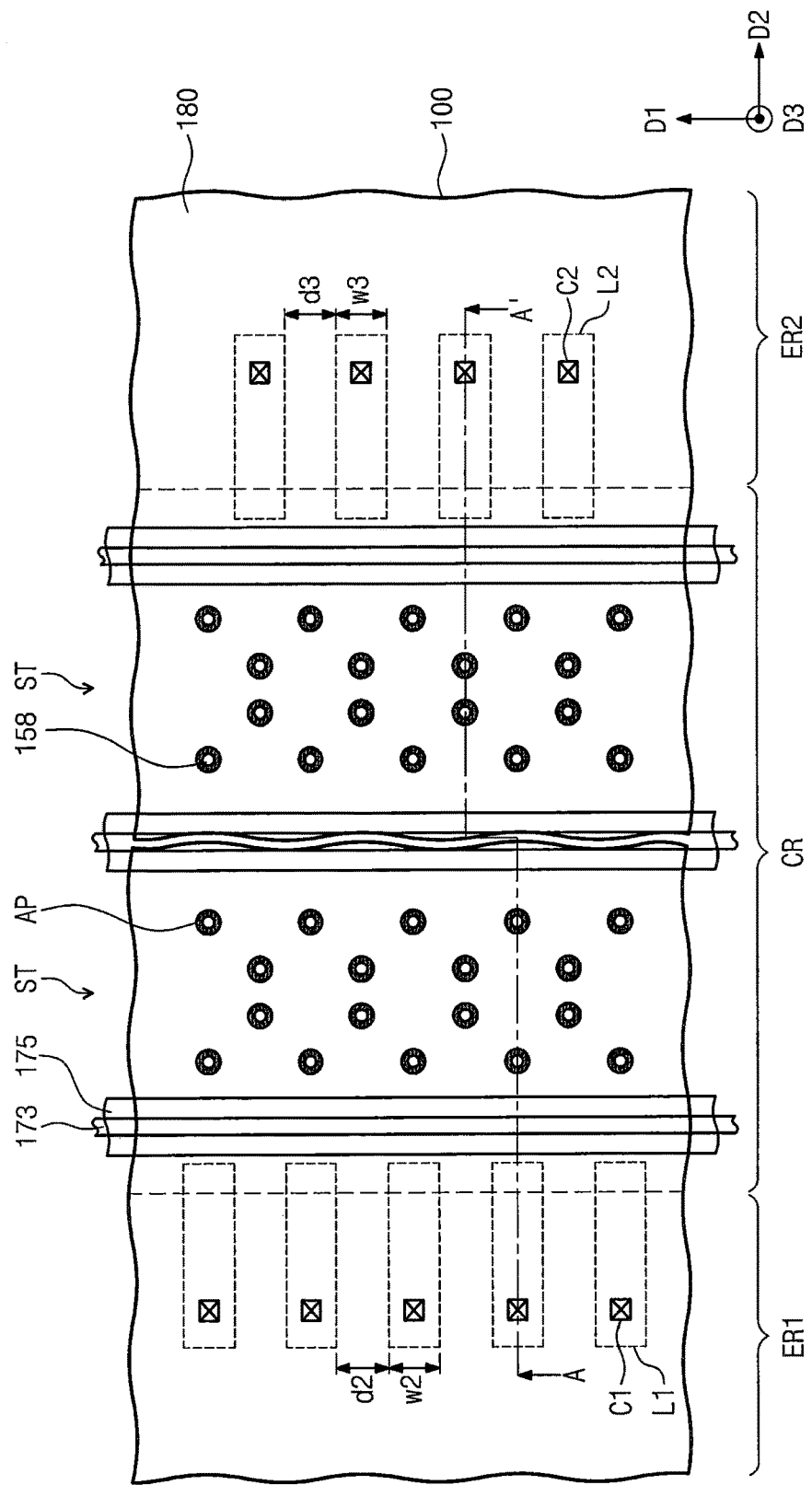
Figure 12B:
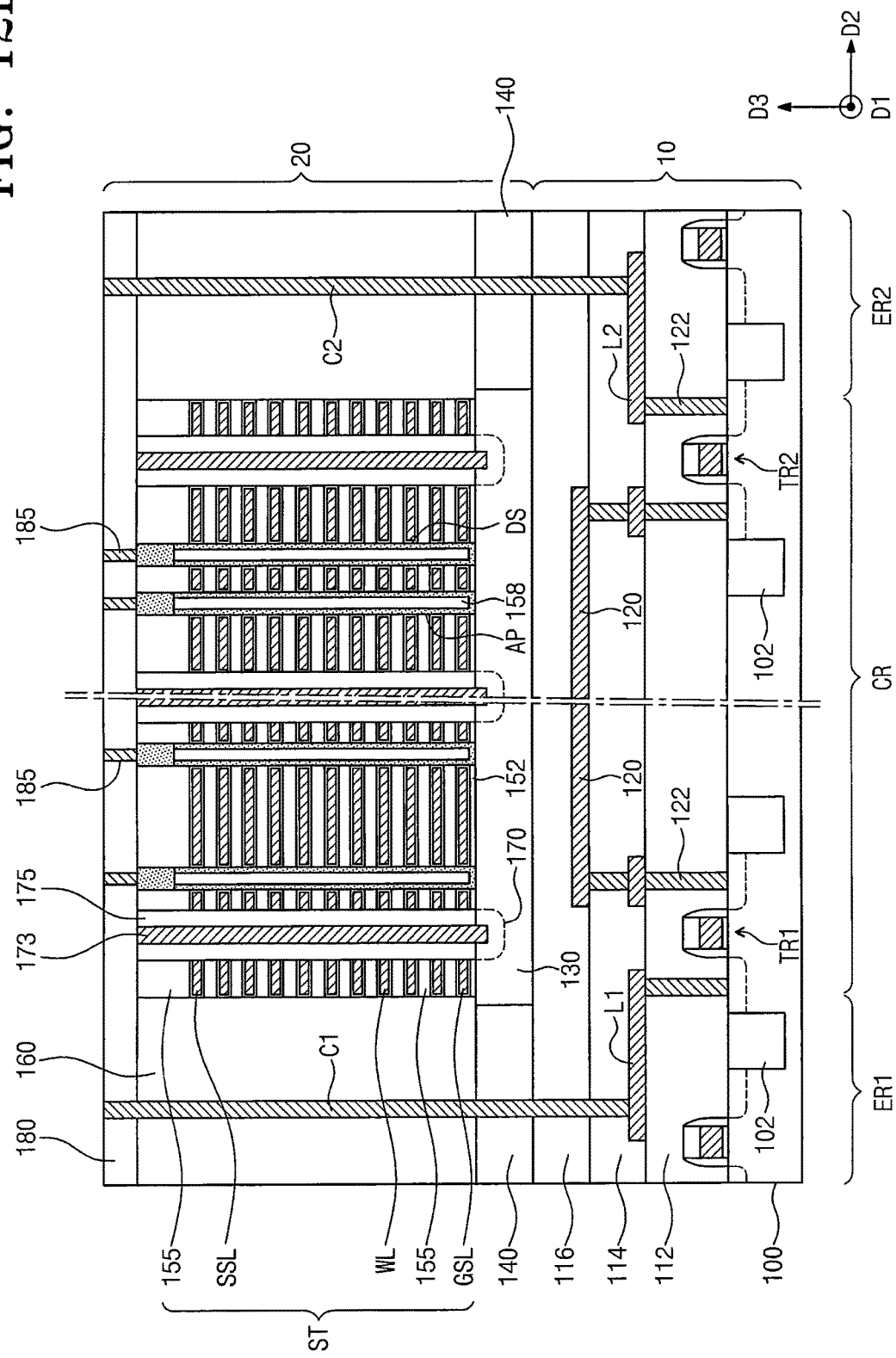

Referring to FIGS. 12A and 12B, common source plugs 173 may be formed in the trenches 165. The common source plugs 173 may include a metal (e.g., tungsten, copper, or aluminum). The common source plugs 173 may be electrically connected to the common source regions 170. One or more isolation insulating layers 175 may be formed between the common source plug 173 and inner sidewalls of the trench 165.

A third upper insulating layer 180 may be formed on the stack structures ST and the second upper insulating layer 160. Bit line contacts 185 may be formed to penetrate the third upper insulating layer 180 to electrically connect to the respective active pillars AP.

First connection contacts C1 may be formed on the first connection region ER1. The first connection contacts C1 may penetrate the third upper insulating layer 180, the second upper insulating layer 160, the first upper insulating layer 140, the third lower insulating layer 116, and the second lower insulating layer 114 to connect to the first connection conductive lines L1 on the first connection region ER1. Second connection contacts C2 may be formed on the second connection region ER2. The second connection contacts C2 may penetrate the third upper insulating layer 180, the second upper insulating layer 160, the first upper insulating layer 140, the third lower insulating layer 116, and the second lower insulating layer 114 to connect to the second connection conductive lines L2 on the second connection region ER2.

Referring again to FIGS. 5A and 5B, a fourth upper insulating layer 190 may be formed on the third upper insulating layer 180. Bit lines BL may be formed in the fourth upper insulating layer 190. First and second end portions of each of the bit lines BL may extend onto the first and second connection regions ER1 and ER2, respectively. A first of a pair of adjacent bit lines BL may be connected to the first connection contact C1, and the second of the pair of adjacent bit lines BL may be connected to the second connection contact C2. In other words, the bit lines BL may include first bit lines BL1 that are connected to the first page buffer 14_1 through the first connection contacts C1 and the first connection conductive lines L1, and second bit lines BL2 that are connected to the second page buffer 14_2 through the second connection contacts C2 and the second connection conductive lines L2. Each of the bit lines BL may have a first width w1, and adjacent bit lines BL may be spaced apart from each other by a first distance d1. The bit lines BL may be formed to have a pitch smaller than the minimum pitch realized by a photolithography process. To achieve this, the bit lines BL may be formed using a double-pattering technique. In an embodiment, grooves may be formed in the fourth upper insulating layer 190, and the bit lines BL may be formed in the grooves, respectively. The grooves in the fourth upper insulating layer 190 may be formed using the double-patterning technique. The bit lines BL may include a conductive material (e.g., copper or aluminum).

Hereinafter, the method of forming the bit lines BL will be described in more detail with reference to FIGS. 13A to 13D.

FIGS. 13A to 13D are cross-sectional views taken along a direction intersecting the bit lines to illustrate a method of forming the bit lines.

Figure 13A:
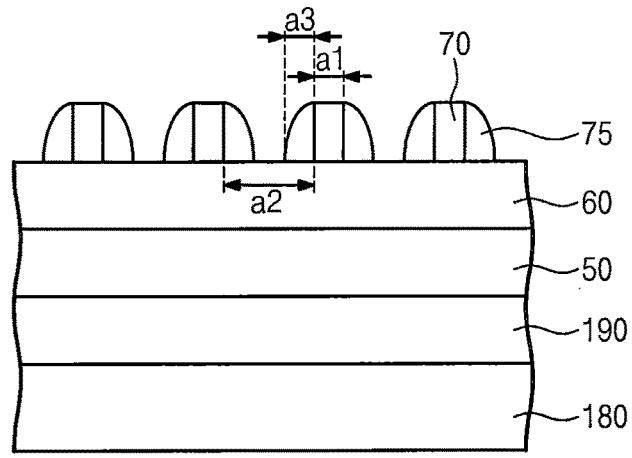
FIGS. 13A to 13D are cross-sectional views taken along a direction that intersects the bit lines of a semiconductor memory device according to an embodiment of the inventive concepts to illustrate a method of forming the bit lines.

Referring to FIG. 13A, the fourth upper insulating layer 190 may be formed on the third upper insulating layer 180, and a hard mask layer may be formed on the fourth upper insulating layer 190. In some embodiments, the hard mask layer may include a first mask layer 60 disposed on the fourth upper insulating layer 190 and a second mask layer 50 disposed between the fourth upper insulating layer 190 and the first mask layer 60. The second mask layer 50 may be formed of a material having an etch selectivity with respect to the fourth upper insulating layer 190. For example, the second mask layer 50 may include poly-silicon. The first mask layer 60 may be formed of a material having an etch selectivity with respect to the second mask layer 50. For example, the first mask layer 60 may include an amorphous carbon layer (ACL). Although not shown, the first mask layer 60 may further include a silicon-containing material (e.g., SiON). In the present embodiment, the hard mask layer may have a double-layered structure. However, the inventive concepts are not limited thereto.

Sacrificial patterns 70 may be formed on the first mask layer 60. In some embodiments, a sacrificial layer may be formed on the first mask layer 60 and a patterning process may be performed on the sacrificial layer to form the sacrificial patterns 70. For example, the sacrificial layer may include a spin-on-hardmask (SOH) layer. Each of the sacrificial patterns 70 may have a line shape extending in the second direction D2. The sacrificial patterns 70 may be spaced apart from each other in a first direction D1 that is perpendicular to the second direction D2. The sacrificial patterns 70 may have substantially the same width a1 and may be spaced apart from each other by a distance a2. In other words, the sacrificial patterns 70 may have a pitch defined as a sum of the width a1 and the distance a2. The distance a2 between the sacrificial patterns 70 may be greater than the width a1 of the sacrificial patterns 70. The pitch of the sacrificial patterns 70 may, for example, correspond to the minimum pitch realized by a photolithography process.

Spacers 75 may be formed on sidewalls of the sacrificial patterns 70. In some embodiments, the spacers 75 may be formed by forming a spacer layer on the fourth upper insulating layer 190 to conformally cover the sacrificial patterns 70, and then performing a blanket anisotropic etching process on the spacer layer until the first mask layer 60 is exposed to form the spacers 75. The spacer layer may include, for example, a silicon oxide layer. The spacer layer may be formed by an atomic layer deposition (ALD) process. In an embodiment, a width a3 of each of the spacers 75 may correspond to about a third of the distance a2 between the sacrificial patterns 70. However, the inventive concepts are not limited thereto.

Figure 13B:
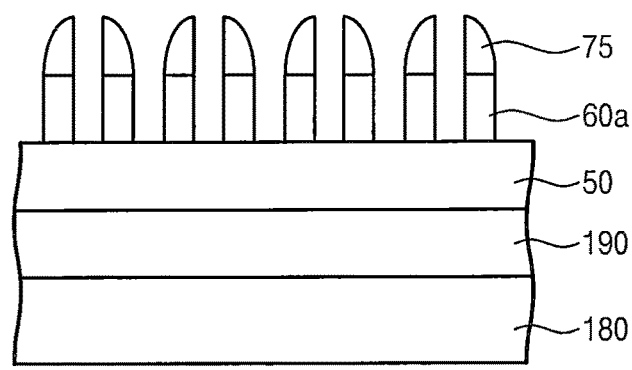

Referring to FIG. 13B, the sacrificial patterns 70 may be removed. In some embodiments, the sacrificial patterns 70 may be removed by an etching process that uses an etch recipe that has etch selectivity with respect to the spacers 75 and the first mask layer 60. Subsequently, the first mask layer 60 may be etched using the spacers 75 as etch masks to form first mask patterns 60a. A distance between the first mask patterns 60a may be substantially equal to the width a1 of the sacrificial patterns 70.

Figure 13C:
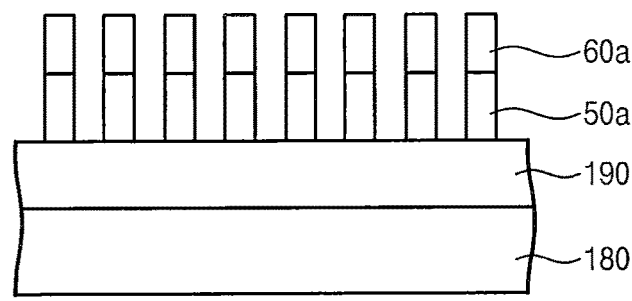

Referring to FIG. 13C, the second mask layer 50 may be etched using the first mask patterns 60a as etch masks to form second mask patterns 50a. The second mask patterns 50a may have the substantially same shapes as the first mask patterns 60a when viewed from a plan view. The spacers 75 may be removed during the etching process for forming the second mask patterns 50a. Alternatively, the spacers 75 may be removed before the formation of the second mask patterns 50a. The first and second mask patterns 60a and 50a may expose the fourth upper insulating layer 190.

Figure 13D:
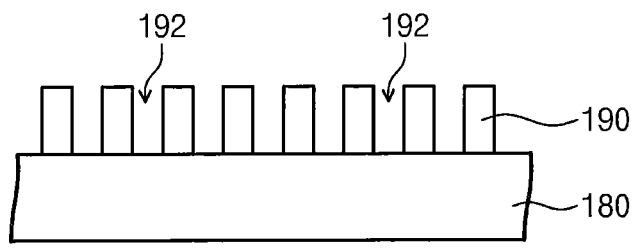

Referring to FIG. 13D, the fourth upper insulating layer 190 may be etched using the first and second mask patterns 60a and 50a as etch masks to form grooves 192 in the fourth upper insulating layer 190. Subsequently, the first and second mask patterns 60a and 50a may be removed. Thereafter, the grooves 192 may be filled with a conductive material (e.g., copper or aluminum), thereby forming the bit lines BL. Thus, it is possible to form the bit lines BL having a pitch smaller than the minimum pitch realized by the photolithography process.

Since the bit lines BL are formed using the double-patterning technique described above, processes of manufacturing the semiconductor memory device may be complex. On the contrary, the connection conductive lines that are connected to the bit lines BL may be divided into the first connection conductive lines L1 and the second connection conductive lines L2, so design rules for the formation of the first and second connection conductive lines L1 and L2 may be increased. As a result, the connection conductive lines L1 and L2 may be more easily formed and may not require a more expensive photolithography apparatus and/or a complex double-patterning technique. Thus, the processes of manufacturing the semiconductor memory device may be simplified and a manufacturing cost of the semiconductor memory device may be reduced.

Figure 14A:
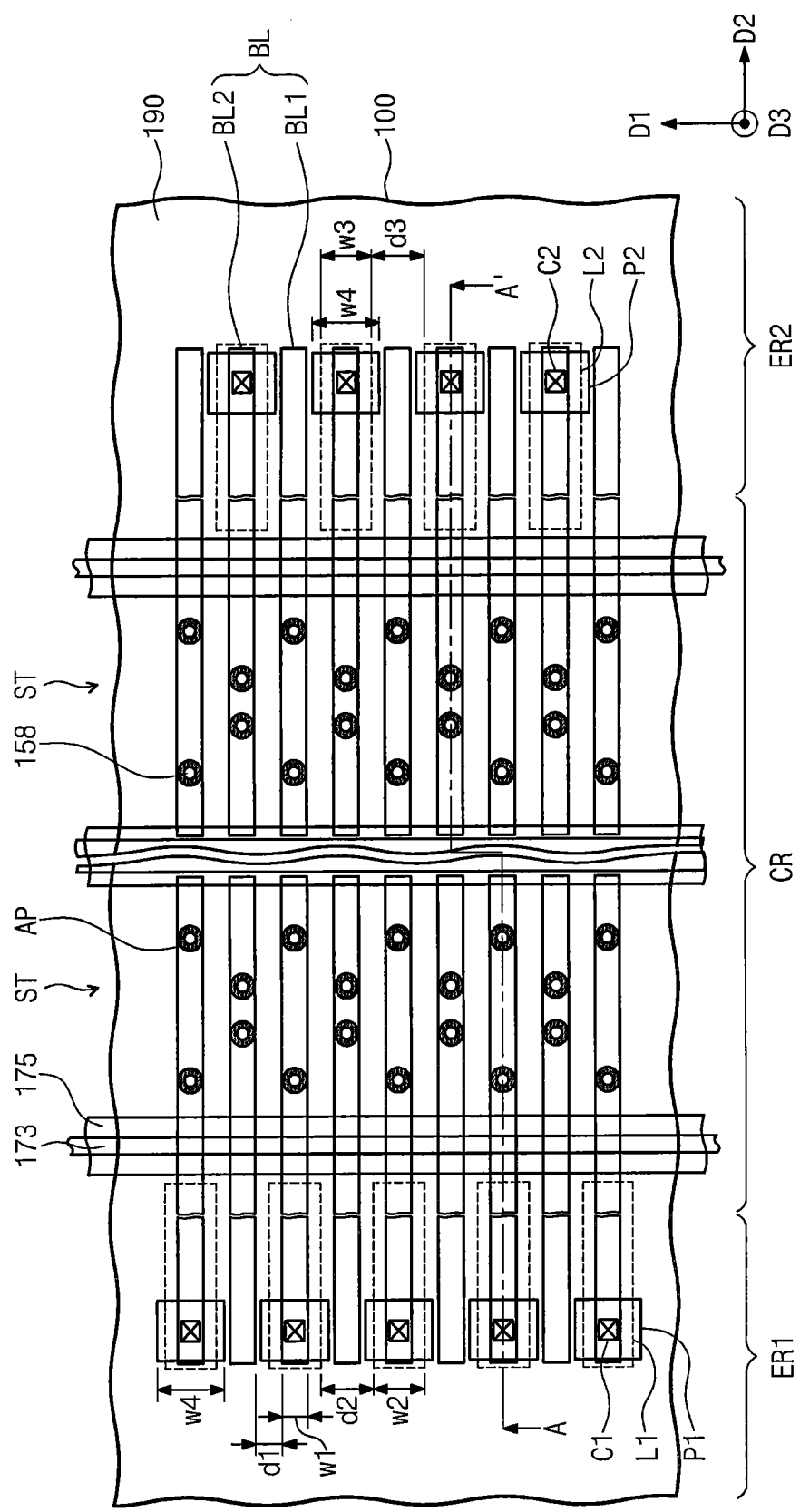
FIG. 14A is a plan view illustrating a semiconductor memory device according to another embodiment of the inventive concepts.
Figure 14B:
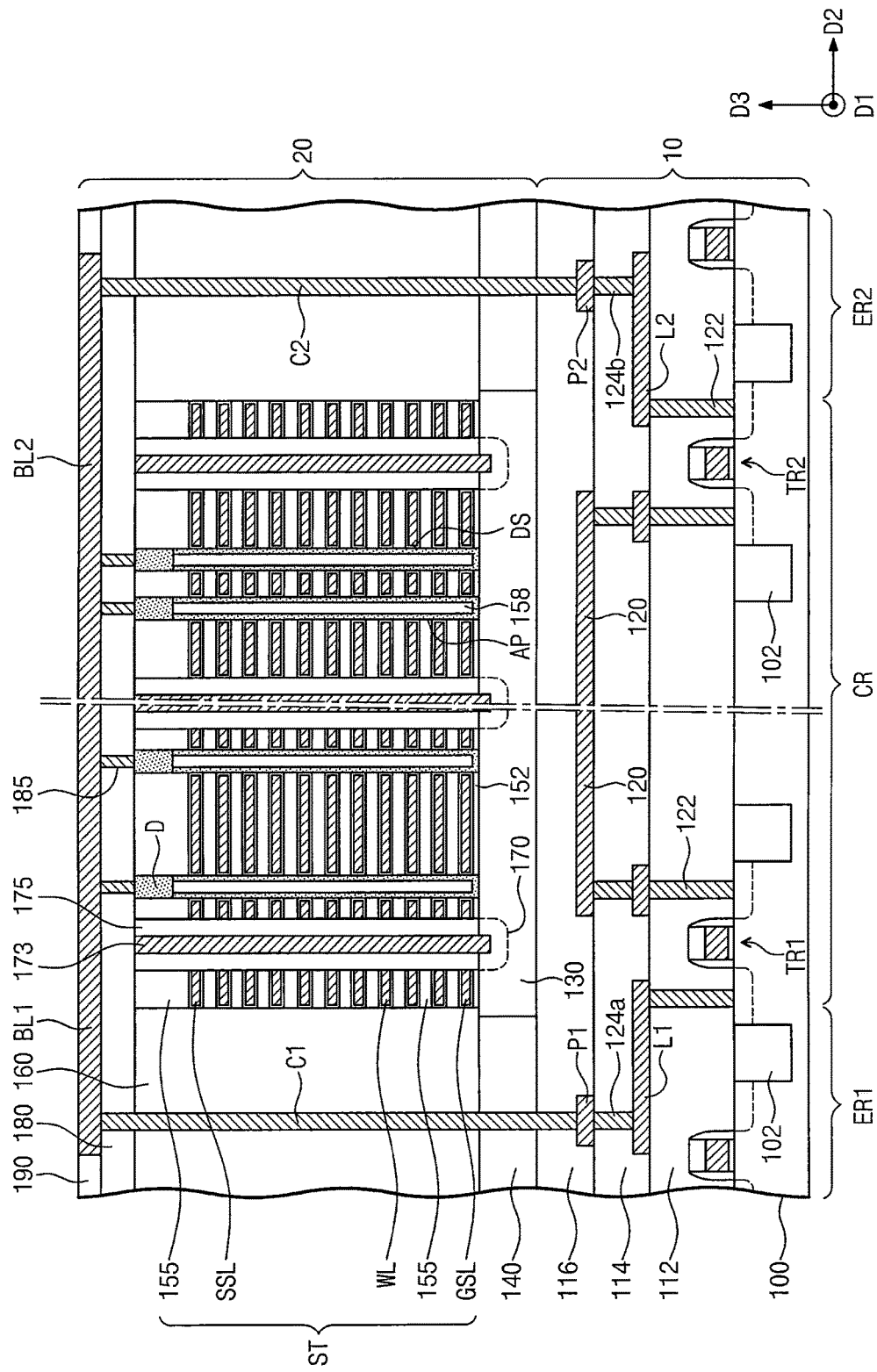
FIG. 14B is a cross-sectional view taken along a line A-A' of FIG. 14A.

FIG. 14A is a plan view illustrating a semiconductor memory device according to another embodiment of the inventive concepts. FIG. 14B is a cross-sectional view taken along a line A-A' of FIG. 14A. In the present embodiment, the same elements as described in the above embodiments will be indicated by the same reference numerals or the same reference designators, and descriptions of these elements will only be mentioned briefly or may be omitted altogether.

Referring to FIGS. 14A and 14B, the semiconductor memory device of the present embodiment may further include connection conductive pads that are provided on the second lower insulating layer 114. The connection conductive pads may include first connection conductive pads P1 that are provided on the first connection region ER1, and second connection conductive pads P2 that are provided on the second connection region ER2. The first connection contacts C1 may directly contact the first connection conductive pads P1, and the second connection contacts C2 may directly contact the second connection conductive pads P2. A width w4 of each of the first and second connection conductive pads P1 and P2 may be greater than the width w1 of the bit lines BL and the widths w2 and w3 of the connection conductive lines L1 and L2. Since the connection conductive pads P1 and P2 having the relatively large widths are formed between the bit lines BL and the connection conductive lines L1 and L2, alignment margins for the connection contacts C1 and C2 may be improved and defects (e.g., a bridge defect) that are caused by misalignment may be reduced or prevented.

First lower connection contacts 124a may be disposed in the second lower insulating layer 114 of the first connection region ER1 to electrically connect the first connection conductive pads P1 to the first connection conductive lines L1. Second lower connection contacts 124b may be disposed in the second lower insulating layer 114 of the second connection region ER2 to electrically connect the second connection conductive pads P2 to the second connection conductive lines L2. Other elements of the semiconductor memory device according to the present embodiment may be the same as or similar to corresponding elements of the semiconductor memory device described with reference to FIGS. 5A and 5B.

Figure 15:
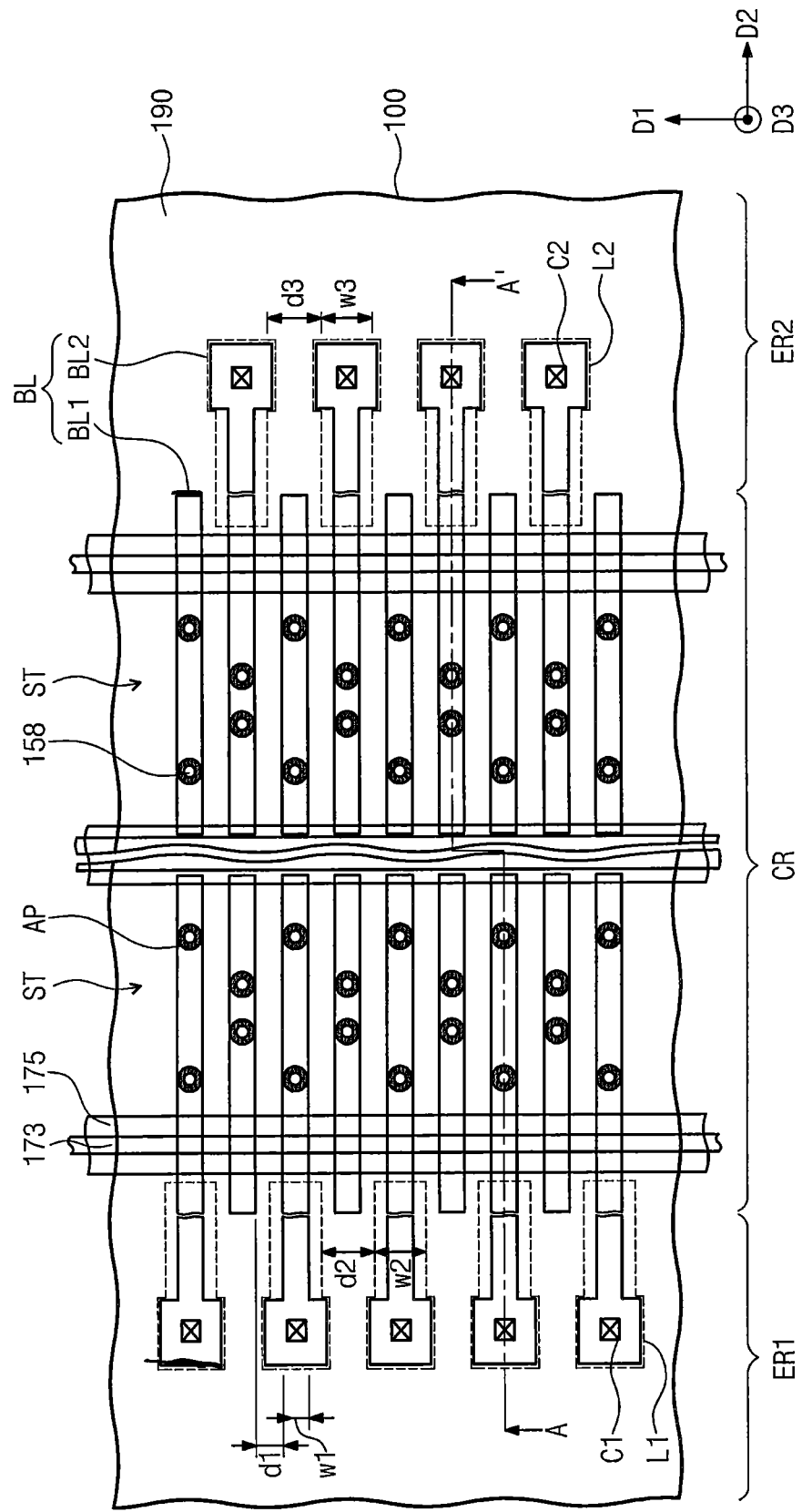
FIG. 15 is a plan view illustrating a semiconductor memory device according to yet another embodiment of the inventive concepts.

FIG. 15 is a plan view illustrating a semiconductor memory device according to still another embodiment of the inventive concepts. Even though not shown in the drawings, a cross-sectional view corresponding to a line A-A' of FIG. 15 may be the same as or similar to FIG. 5B. In the present embodiment, the same elements as described in the above embodiments will be indicated by the same reference numerals or the same reference designators, and descriptions of these elements will only be mentioned briefly or may be omitted altogether.

Referring to FIG. 15, first end portions of the first bit lines BL1 may extend onto the first connection region ER1, but second end portions of the first bit lines BL1 may not extend onto the second connection region ER2. On the first connection region ER1, a width of the first end portion of each of the first bit lines BL1 may be greater than the first width w1 of a line portion of each of the first bit lines BL1. Similarly, first end portions of the second bit lines BL2 may not extend onto the first connection region ER1, but second end portions of the second bit lines BL2 may extend onto the second connection region ER2. On the second connection region ER2, a width of the second end portion of each of the second bit lines BL2 may be greater than the first width w1 of a line portion of each of the second bit lines BL2.

On the first connection region ER1, shapes of the first connection conductive lines L1 may correspond to the shapes of the first bit lines BL1. In other words, a width of an end portion of each of the first connection conductive lines L1 may be greater than the second width w2 of a line portion of each of the first connection conductive lines L1. Likewise, on the second connection region ER2, shapes of the second connection conductive lines L2 may correspond to the shapes of the second bit lines BL2. In other words, a width of an end portion of each of the second connection conductive lines L2 may be greater than the third width w3 of a line portion of each of the second connection conductive lines L2. Thus, the alignment margins of the connection contacts C1 and C2 may be improved without additional connection conductive pads P1 and P2. Other elements of the semiconductor memory device according to the present embodiment may be the same as or similar to corresponding elements of the semiconductor memory device described with reference to FIGS. 5A and 5B.

Figure 16:
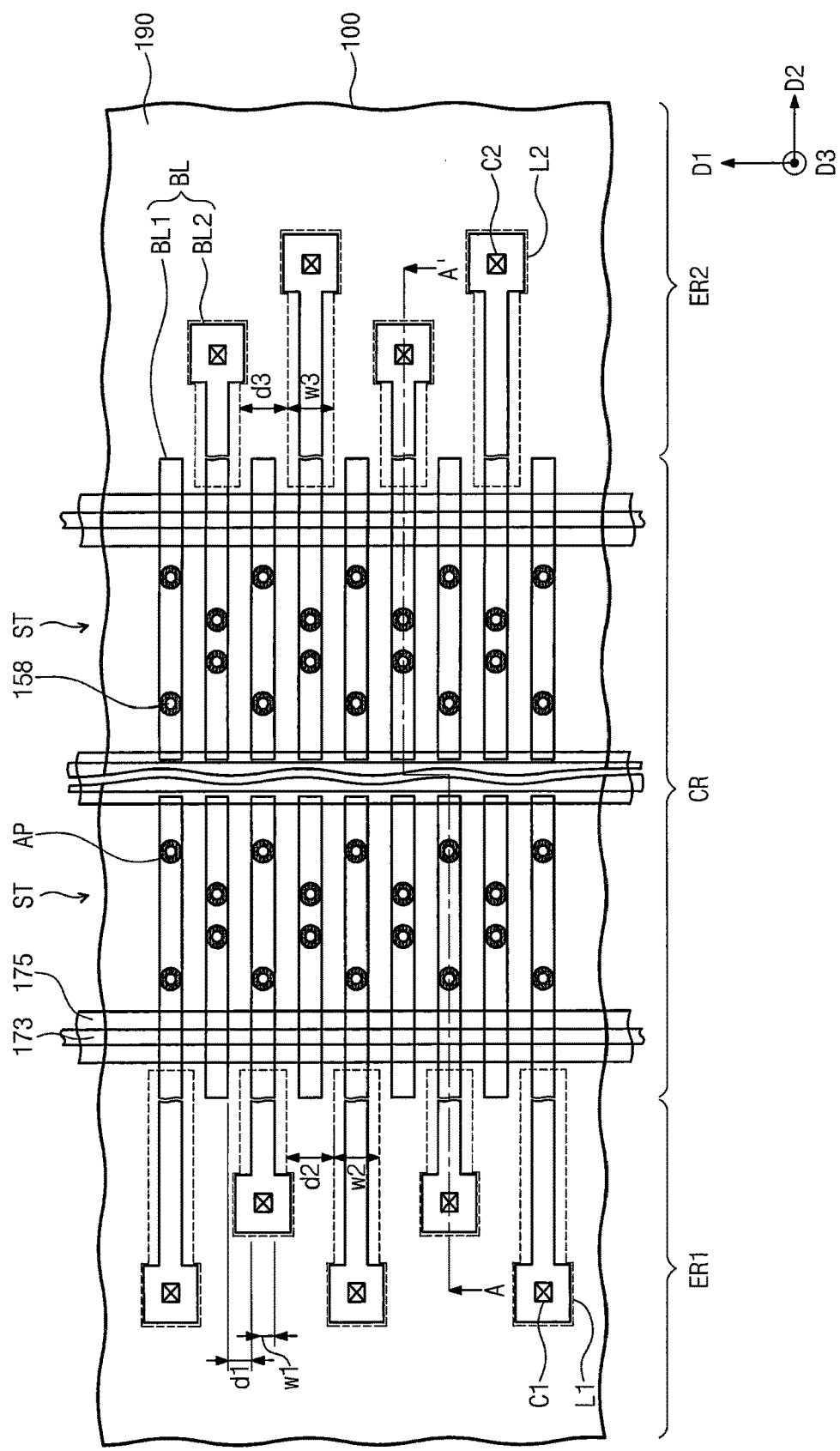
FIG. 16 is a plan view illustrating a semiconductor memory device according to a further embodiment of the inventive concepts.

FIG. 16 is a plan view illustrating a semiconductor memory device according to yet another embodiment of the inventive concepts. Even though not shown in the drawings, a cross-sectional view corresponding to a line A-A' of FIG. 16 may be the same as or similar to FIG. 5B. The semiconductor memory device of FIG. 16 may be the substantially same as or similar to the semiconductor memory device of FIG. 15, except that positions of end portions of some of the bit lines BL are different from those of end portions of others of the bit lines BL on each of the connection regions. In the present embodiment, descriptions of the same elements as in the above embodiments may only be mentioned briefly or may be omitted altogether.

Referring to FIG. 16, on the first connection region ER1, positions (e.g., coordinates in the second direction D2) of end portions of adjacent ones of the first bit lines BL1 may be different from each other. End portions of the first bit lines BL1 may protrude from the circuit region CR in a direction opposite to the second direction D2 when viewed from a plan view. The protruding lengths of the end portions of adjacent ones of the first bit lines BL1 may be different from each other. In other words, the protruding length of a first of a pair of adjacent first bit lines BL1 may be greater than the protruding length of the second of the pair of adjacent first bit lines BL1. The first bit lines BL1 may be repeatedly arranged along the first direction D1 in such a way to satisfy the above mentioned positional relationship.

Likewise, on the second connection region ER2, positions (e.g., coordinates in the second direction D2) of end portions of adjacent ones of the second bit lines BL2 may be different from each other. End portions of the second bit lines BL2 may protrude from the circuit region CR in the second direction D2 when viewed from a plan view. The protruding lengths of the end portions of adjacent ones of the second bit lines BL2 may be different from each other. In other words, the protruding length of a first of a pair of adjacent second bit lines BL2 may be greater than the protruding length of the second of the pair of adjacent second bit lines BL2. The second bit lines BL2 may be repeatedly arranged along the first direction D1 in such a way to satisfy the above mentioned positional relationship. Since the first and second bit lines BL1 and BL2 have the positional relationships as described above, it is possible to increase a distance between the end portions of adjacent ones of the first bit lines BL1 on the first connection region ER1 and a distance between the end portions of adjacent ones of the second bit lines BL2 on the second connection region ER2. As a result, widths of the end portions of the first and second bit lines BL1 and BL2 may be increased to more easily form the connection contacts C1 and C2. Shapes of the first connection conductive lines L1 may correspond to the shapes of the first bit lines BL1 on the first connection region ER1. In other words, protruding lengths of adjacent ones of the first connection conductive lines L1 may be different from each other when viewed from a plan view. Likewise, shapes of the second connection conductive lines L2 may correspond to the shapes of the second bit lines BL2 on the second connection region ER2. In other words, protruding lengths of adjacent ones of the second connection conductive lines L2 may be different from each other when viewed from a plan view.

Figure 17:
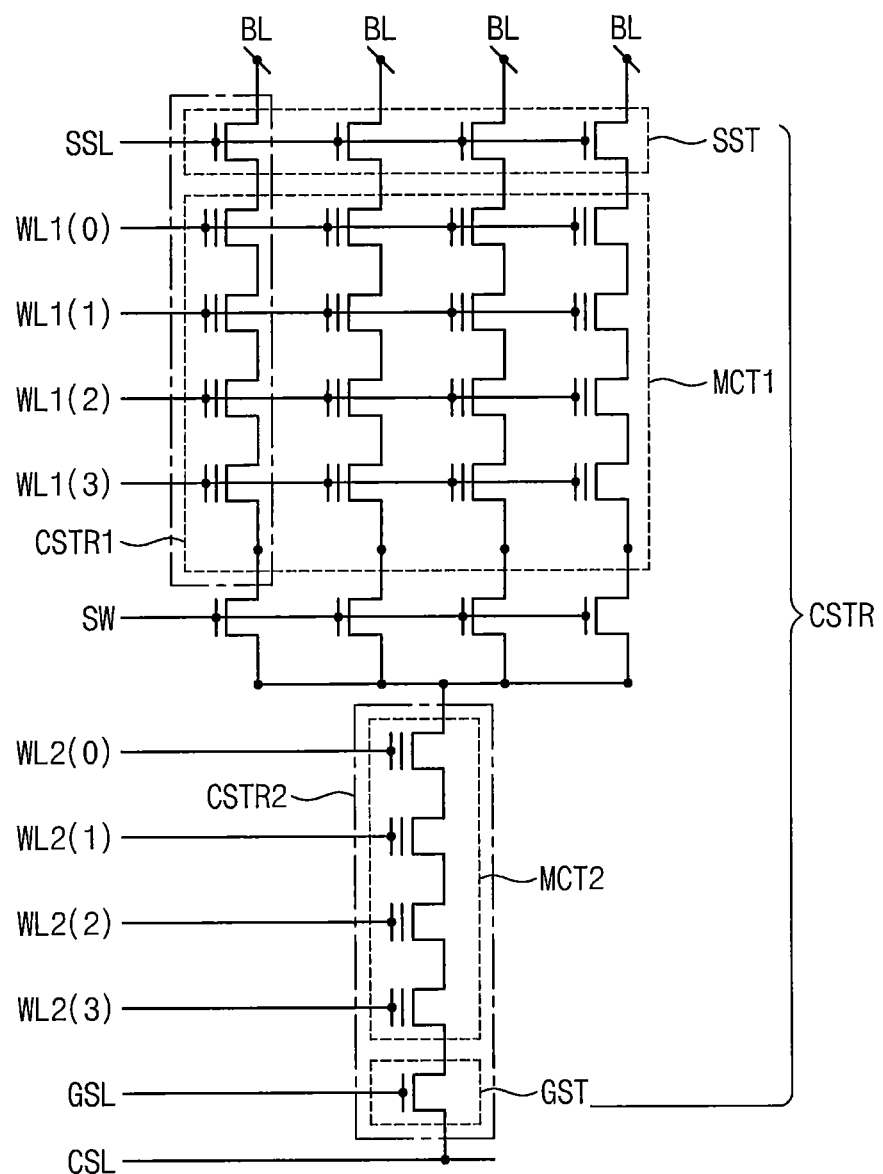
FIG. 17 is a circuit diagram illustrating an embodiment of a memory structure included in a semiconductor memory device according to still another embodiment of the inventive concepts.

FIG. 17 is a circuit diagram illustrating an embodiment of a memory structure included in a semiconductor memory device according to an embodiment of the inventive concepts.

Referring to FIG. 17, a memory structure 20 according to the present embodiment may include a common source line CSL, a plurality of bit lines BL, and a cell string CSTR between the common source line CSL and the bit lines BL.

The common source line CSL may be a conductive layer disposed on a substrate, and the bit lines BL may be conductive patterns (e.g., metal lines) disposed on the substrate.

The cell string CSTR may include a plurality of upper strings CSTR1 respectively connected to the bit lines BL and one lower string CSTR2 connected to the common source line CSL. The plurality of upper strings CSTR1 may be connected in common to the one lower string CSTR2. Each of the upper strings CSTR1 may be connected to the lower string CSTR2 through a respective switching element SW. The switching elements SW connected to the upper strings CSTR1 may be electrically controlled to receive the same voltage.

Each of the upper strings CSTR1 may include a string selection transistor SST connected to each of the bit lines BL, and a plurality of upper memory cell transistors MCT1 that are disposed between the string selection transistor SST and the switching element SW. The string selection transistor SST and the upper memory cell transistors MCT1 may be connected in series to each other. The lower string CSTR2 may include a ground selection transistor GST connected to the common source line CSL, and a plurality of lower memory cell transistors MCT2 that are disposed between the ground selection transistors GST and the switching elements SW. The ground selection transistor GST and the lower memory cell transistors MCT2 may be connected in series to each other.

A string selection line SSL and upper word lines WL1(0) to WL1(3), which are disposed between the bit lines BL and the switching elements SW, may be used as gate electrodes of the string selection transistor SST and upper memory cell transistors MCT1, respectively. A ground selection line GSL and lower word lines WL2(0) to WL2(3), which are disposed between the common source line CSL and the switching elements SW, may be used as gate electrodes of the ground selection transistor GST and lower memory cell transistors MCT2, respectively. Each of the upper and lower memory cell transistors MCT1 and MCT2 may include a data storage element.

A plurality of the upper strings CSTR1 respectively connected to the bit lines BL may be connected in common to the one lower string CSTR2 that is connected to the common source line CSL. Thus, the upper strings CSTR1 including the string selection transistors SST respectively connected to the bit lines BL may share the ground selection transistor GST included in the one lower string CSTR2. In other words, the upper strings CSTR1 that are connected to different bit lines so as to be operated independently of each other may be connected in common to the one lower string CSTR2 to share the ground selection transistor GST, so a highly integrated semiconductor memory device may be realized.

Figure 18:
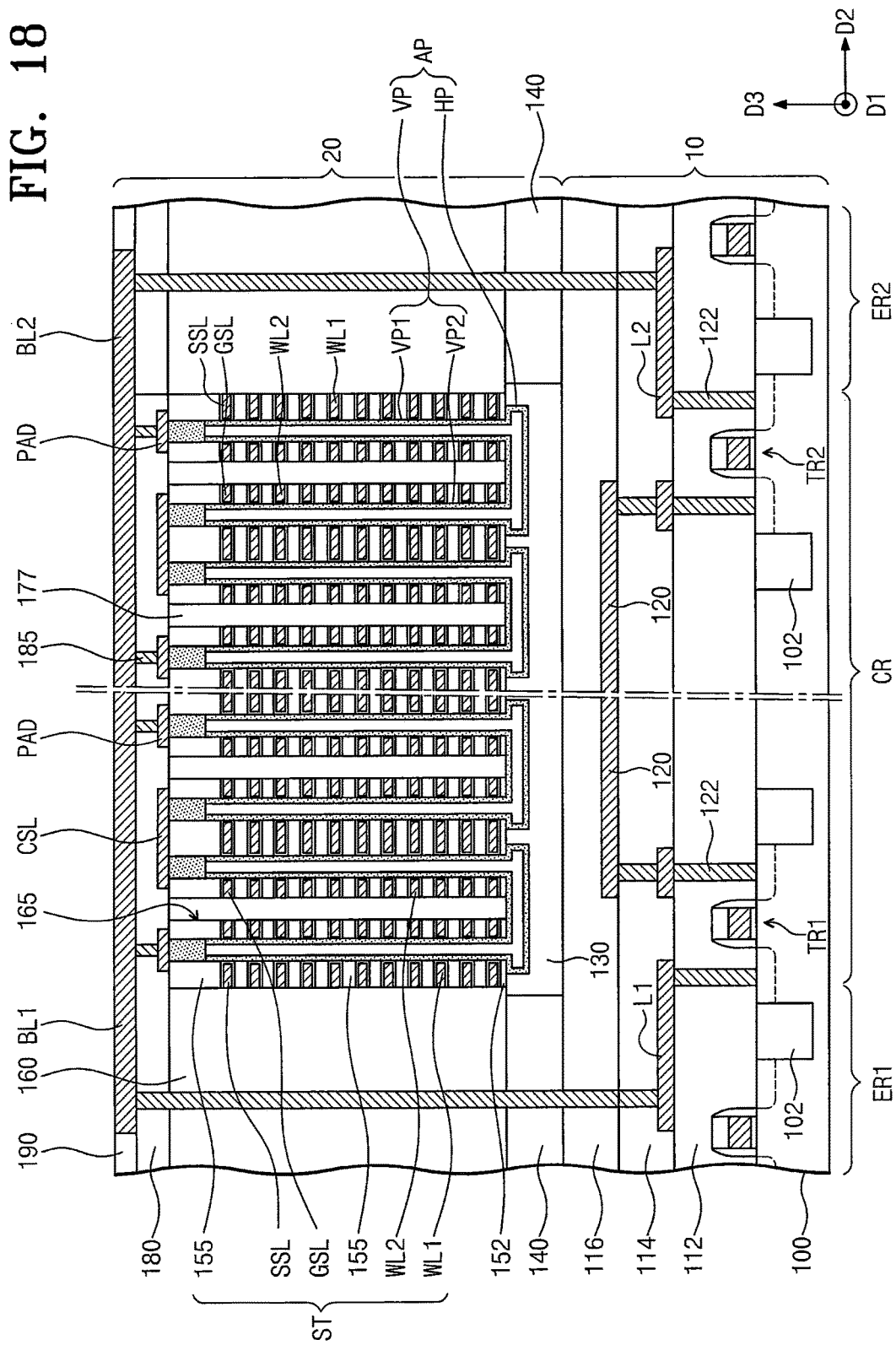
FIG. 18 is a cross-sectional view illustrating a semiconductor memory device according to yet another embodiment of the inventive concepts.

FIG. 18 is a cross-sectional view illustrating a semiconductor memory device according to still another embodiment of the inventive concepts. In the present embodiment, the same elements as described in the above embodiments will be indicated by the same reference numerals or the same reference designators, and thus descriptions of these elements will only be mentioned briefly or may be omitted altogether.

Referring to FIG. 18, the memory structure 20 may include a semiconductor layer 130, stack structures ST on the semiconductor layer 130, and a plurality of active pillars AP penetrating the stack structures ST. The stack structures ST may include insulating patterns 155 and electrodes between the insulating patterns 155.

The electrodes of each of the stack structures ST may be sequentially stacked on the semiconductor layer 130 in a vertical direction (e.g., a third direction D3). The electrodes may include a string selection line SSL, word lines, and a ground selection lines GSL. The string selection line SSL may be between the word lines and the bit lines BL. The ground selection line GSL may be between the word lines and a common source line CSL. The word lines of each of the stack structures ST may be sequentially stacked on the semiconductor layer 130. The string selection line SSL and the ground selection line GSL may be on the word lines. The string selection line SSL and the ground selection line GSL may be spaced apart from each other in the second direction D2 by a trench 165. The word lines may include upper word lines WL1 that are between the semiconductor layer 130 and the string selection line SSL and lower word lines WL2 that are between the semiconductor layer 130 and the ground selection line GSL. The upper word lines WL1 may be spaced apart from the lower word lines WL2 in the second direction D2 by the trench 165.

A device isolation pattern 177 may be provided between the string selection line SSL and the ground selection line GSL and between the upper word lines WL1 and the lower word lines WL2. The device isolation pattern 177 may have a linear shape and may extend in the first direction D1. The device isolation pattern 177 may fill the trench 165 and may include at least one of a silicon oxide layer, a silicon nitride layer, or a silicon oxynitride layer.

The active pillars AP may be arranged along the first direction D1 when viewed from a plan view. Each of the active pillars AP may include vertical portions VP that penetrate the stack structures ST and a horizontal portion HP that is disposed under the stack structures ST to connect the vertical portions VP of two adjacent active pillars AP to each other. The vertical portions VP may be provided in vertical holes penetrating the stack structures ST. The horizontal portions HP may be provided in horizontal recesses in an upper portion of the semiconductor layer 130. One of the vertical portions VP of each active pillar AP may be connected to the common source line CSL and the other of the vertical portions VP of each active pillar AP may be connected to one of the bit lines BL. The horizontal portion HP may be provided between the semiconductor layer 130 and the stack structures ST to connect the vertical portions VP to each other.

In more detail, the vertical portions VP of each active pillar AP may include a first vertical portion VP1 that penetrates the string selection line SSL and the upper word lines WL1, and a second vertical portion VP2 that penetrates the ground selection line GSL and the lower word lines WL2. The first vertical portion VP1 may be connected to one of the bit lines BL through a pad PAD and a bit line contact 185, and the second vertical portion VP2 may be connected to the common source line CSL. The horizontal portion HP may extend from under the upper word lines WL1 to under the lower word lines WL2 so as to electrically connect the first vertical portion VP1 to the second vertical portion VP2.

Each of the active pillars AP may include a semiconductor pattern that penetrates the stack structure ST so as to be electrically coupled to the semiconductor layer 130. The semiconductor pattern included in the vertical portion VP may cover inner sidewalls of the vertical holes. The semiconductor pattern included in the horizontal portion HP may cover an inner surface of the horizontal recess. Other elements of the semiconductor memory device according to the present embodiment may be the same as or similar to corresponding elements of the semiconductor memory device described above with reference to FIGS. 5A and 5B.

In the semiconductor memory devices according to embodiments of the inventive concepts, the logic structure driving the memory structure may be disposed under the memory structure, so that the integration density of the semiconductor memory device may be improved. In addition, according to embodiments of the inventive concepts, the page buffer may be divided into first and second page buffers that are disposed at opposed sides of the memory structure, thereby increasing the widths of the connection conductive lines that electrically connect the bit lines to the page buffer. As a result, the resistance characteristics of the connection conductive lines may be improved, so the electrical characteristics of the semiconductor memory device may be improved.

Furthermore, since the widths of the connection conductive lines are increased, it is possible to easily arrange and form the connection contacts electrically connecting the bit lines to the connection conductive lines. As a result, the highly integrated semiconductor memory device may be more easily realized.

While the inventive concepts have been described above with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scope of the inventive concepts are to be determined by the broadest permissible interpretation of the following claims and their equivalents, and shall not be restricted or limited by the foregoing description.

What is claimed is:

1. A semiconductor memory device, comprising:
a substrate having an upper surface that extends in a first direction and in a second direction that is perpendicular to the first direction;
a memory cell array on the substrate;
a first page buffer under the memory cell array, the first page buffer being adjacent a first side of the memory cell array;
a second page buffer under the memory cell array, the second page buffer being adjacent a second side, opposite to the first side, of the memory cell array;
a plurality of bit lines that extend in the second direction to at least partly cross the memory cell array, the bit lines including:
a plurality of first bit lines that are electrically connected to the first page buffer; and
a plurality of second bit lines that are electrically connected to the second page buffer;
a plurality of first connection conductive lines that extend in the second direction, wherein the first connection conductive lines electrically connect respective ones of the first bit lines to the first buffer; and
a plurality of second connection conductive lines that extend in the second direction, wherein the second connection conductive lines electrically connect respective ones of the second bit lines to the second page buffer,
wherein the first bit lines and the second bit lines are alternately and repeatedly arranged in the first direction, and
wherein a first distance between adjacent ones of the first connection conductive lines is greater than a second distance between adjacent ones of the bit lines, and wherein a third distance between adjacent ones of the second connection conductive lines is greater than the second distance.

2. The semiconductor memory device of claim 1, wherein an average width of a first of the first connection conductive lines in the first direction is greater than an average width in the first direction of a first of the first bit lines, and an average width of a first of the second connection conductive lines in the first direction is greater than an average width in the first direction of a first of the second bit lines.

3. The semiconductor memory device of claim 1, wherein the substrate includes a first connection region, a second connection region and a circuit region therebetween, the memory cell array being disposed on the circuit region, and wherein the first bit lines extend onto the first connection region, and the second bit lines extend onto the second connection region.

4. The semiconductor memory device of claim 3, wherein a maximum width of a first portion of a first of the first bit lines that is on the first connection region exceeds a maximum width of a second portion of the first of the first bit lines that crosses the memory cell array, and a maximum width of a first portion of a first of the second bit lines that is on the second connection region exceeds a maximum width of a second portion of the first of the second bit lines that crosses the memory cell array.

5. The semiconductor memory device of claim 3, wherein a maximum width of a first portion of a first of the first connection conductive lines that is on the first connection region exceeds a maximum width of a second portion of the first of the first connection conductive lines that is under the memory cell array, and a maximum width of a first portion of a first of the second connection conductive lines that is on the second connection region, exceeds a maxim width of a second portion of the first of the second connection conductive lines that is under the memory cell array.

6. The semiconductor memory device of claim 1, wherein the first of the first connection conductive lines extends a different distance in the second direction onto a first connection region than does a second of the first connection conductive lines that is adjacent to the first of the first connection conductive lines, and
wherein the first of the second connection conductive lines extends a different distance in the second direction onto a second connection region than does a second of the second connection conductive lines that is adjacent to the first of the second connection conductive lines.

7. The semiconductor memory device of claim 1, wherein each of the first and second bit lines includes a first conductive material, and each of the first and second connection conductive lines includes a second conductive material that has a melting point that is higher than a melting point of the first conductive material.

8. The semiconductor memory device of claim 7, wherein the first conductive material includes copper (Cu) or aluminum (Al) and the second conductive material includes tungsten (W).

9. A semiconductor memory device, comprising:
a substrate having a circuit region and first and second connection regions on opposed sides of the circuit region, the substrate including an upper surface that extends in a first direction and in a second direction that is perpendicular to the first direction;
a memory cell array on the substrate;
a plurality of bit lines that extend in the second direction to at least partially cross the circuit region, the bit lines spaced apart from each other in the first direction;
a plurality of connection conductive lines that extend in the second direction and that are electrically connected to respective ones of the bit lines; and
a page buffer circuit that includes a first page buffer and a second page buffer, and wherein the connection conductive lines comprise first connection conductive lines and second connection conductive lines,
wherein an average width in the first direction of a first of the connection conductive lines is greater than an average width in the first direction of the one of the bit lines to which the first of the connection conductive lines is electrically connected, and
wherein the bit lines comprise first bit lines that are electrically connected to the first page buffer by respective ones of the first connection conductive lines and second bit lines that are electrically connected to the second page buffer by respective ones of the second connection conductive lines, and wherein the first bit lines and the second bit lines are alternately and repeatedly arranged in the first direction.

10. The semiconductor memory device of claim 9, further comprising:
a plurality of first lower contacts and a plurality of second lower contacts that extend in a third direction that is perpendicular to the first direction and to the second direction; and
a plurality of first connection contacts and a plurality of second connection contacts that extend in the third direction,
wherein each first connection conductive line directly contacts a respective one of the first lower contacts and a respective one of the first connection contacts, and
wherein each second connection conductive line directly contacts a respective one of the second lower contacts and a respective one of the second connection contacts.

11. The semiconductor memory device of claim 10, wherein each bit line has a first end portion that is adjacent a first side of the memory cell array and a second end portion that is adjacent a second side of the memory cell array, and wherein the first end portions of the first bit lines directly contact respective ones of the first connection contacts and the second end portions of the second bit lines directly contact respective ones of the second connection contacts.

12. The semiconductor memory device of claim 11, wherein the first end portions of the first bit lines have an expanded width in the first direction.

13. The semiconductor memory device of claim 10, wherein portions of the first connection conductive lines that directly contact the respective first connection contacts have an expanded width in the first direction.

14. The semiconductor memory device of claim 9, wherein the first and second bit lines include a first conductive material, and the first and second connection conductive lines include a second conductive material that has a melting point that is higher than a melting point of the first conductive material.

15. The semiconductor memory device of claim 14, wherein the first conductive material includes copper (Cu) or aluminum (Al) and the second conductive material includes tungsten (W).

16. A semiconductor memory device, comprising:
a substrate having an upper surface that extends in a first direction and in a second direction that is perpendicular to the first direction;
a logic circuit on the upper surface of the substrate, the logic circuit including a first page buffer;
a memory cell array on the logic circuit opposite the substrate, the memory cell array comprising;
a semiconductor layer;
a plurality of stack structures that are spaced apart from each other in the second direction, the stack structures including a plurality of electrodes that are stacked on the semiconductor layer in a third direction that is perpendicular to the first direction and to the second direction;
a plurality of first bit lines that extend in the second direction to at least partially cross the stack structures, the first bit lines spaced apart from each other in the first direction; and
a plurality of insulating layers that extend in, the first direction that are provided between adjacent ones of the stack structures; and
a plurality of first connection contacts that penetrate a first of the insulating layers, the first connection contacts electrically connecting respective ones of the first bit lines to the first page buffer,
wherein a maximum width of an end portion of a first of the first bit lines exceeds a maximum width of a central portion of the first of the first bit lines.

17. The semiconductor memory device of claim 16, wherein the memory cell array further comprises a plurality of second bit lines that extend in the second direction to at least partially cross the stack structures, the first and second bit lines alternately and repeatedly arranged in the first direction, the semiconductor memory device further comprising:
a second page buffer; and
a plurality of second connection contacts that electrically connect respective ones of the second bit lines to the second page buffer.

* * * * *